United States Patent
Kawabata et al.

(10) Patent No.: US 11,487,202 B2
(45) Date of Patent: Nov. 1, 2022

(54) PHOTOSENSITIVE RESIN COMPOSITION, POLYMER PRECURSOR, CURED FILM, LAMINATE, METHOD FOR PRODUCING CURED FILM, AND SEMICONDUCTOR DEVICE

(71) Applicant: FUJIFILM Corporation, Tokyo (JP)

(72) Inventors: Takeshi Kawabata, Shizuoka (JP); Kenta Yoshida, Shizuoka (JP); Yu Iwai, Shizuoka (JP); Akinori Shibuya, Shizuoka (JP)

(73) Assignee: FUJIFILM Corporation, Tokyo (JP)

(*) Notice: Subject to any disclaimer, the term of this patent is extended or adjusted under 35 U.S.C. 154(b) by 405 days.

(21) Appl. No.: 16/689,389

(22) Filed: Nov. 20, 2019

(65) Prior Publication Data

US 2020/0089113 A1    Mar. 19, 2020

Related U.S. Application Data

(63) Continuation of application No. PCT/JP2018/020369, filed on May 28, 2018.

(30) Foreign Application Priority Data

May 31, 2017    (JP) .............................. JP2017-108409

(51) Int. Cl.
*G03F 7/037* (2006.01)
*G03F 7/004* (2006.01)
(Continued)

(52) U.S. Cl.
CPC .......... *G03F 7/037* (2013.01); *C08G 73/1067* (2013.01); *C08G 73/22* (2013.01); *G03F 7/0045* (2013.01); *H01L 21/563* (2013.01); *H01L 23/293* (2013.01); *G03F 7/162* (2013.01); *G03F 7/168* (2013.01); *G03F 7/2004* (2013.01); *G03F 7/325* (2013.01); *G03F 7/38* (2013.01)

(58) Field of Classification Search
CPC ........ G03F 7/037; G03F 7/0045; G03F 7/162; G03F 7/168; G03F 7/2004; G03F 7/325;
(Continued)

(56) References Cited

U.S. PATENT DOCUMENTS

2007/0093640 A1    4/2007    Kim et al.
2013/0062787 A1    3/2013    Kawamori et al.
2018/0079864 A1    3/2018    Kawabata et al.

FOREIGN PATENT DOCUMENTS

EP    3 162 868 A1    5/2017
JP    2003-231752 A    8/2003
(Continued)

OTHER PUBLICATIONS

Office Action dated Aug. 26, 2021 by the Taiwanese Patent Office in Taiwanese Application No. 107118208.
(Continued)

*Primary Examiner* — Caleen O Sullivan
(74) *Attorney, Agent, or Firm* — Sughrue Mion, PLLC

(57) ABSTRACT

A photosensitive resin composition is also provided that includes a polymer precursor selected from a polyimide precursor and a polybenzoxazole precursor; a photo-radical polymerization initiator; and a solvent, in which an acid value of an acid group contained in the polymer precursor and having a neutralization point in a pH range of 7.0 to 12.0 is in a range of 2.5 to 34.0 mgKOH/g, and either the polymer precursor contains a radically polymerizable group or the photosensitive resin composition includes a radically polymerizable compound other than the polymer precursor.

28 Claims, 1 Drawing Sheet

(51) Int. Cl.
*C08G 73/10* (2006.01)
*C08G 73/22* (2006.01)
*H01L 23/29* (2006.01)
*H01L 21/56* (2006.01)
*G03F 7/16* (2006.01)
*G03F 7/20* (2006.01)
*G03F 7/32* (2006.01)
*G03F 7/38* (2006.01)

(58) Field of Classification Search
CPC . G03F 7/38; G03F 7/032; G03F 7/004; G03F 7/027; G03F 7/32; G03F 7/20; C08G 73/1067; C08G 73/22; C08G 73/06; C08G 73/0233; C08G 73/10; H01L 21/563; H01L 23/293; H01L 21/027; C08F 283/04; C08F 20/00; C08F 2/44; C08F 2/50
USPC .............................. 257/792; 430/270.1, 311
See application file for complete search history.

(56) References Cited

FOREIGN PATENT DOCUMENTS

| | | |
|---|---|---|
| JP | 2006-119513 A | 5/2006 |
| JP | 2006-251715 A | 9/2006 |
| JP | 2006-521452 A | 9/2006 |
| JP | 2007-94342 A | 4/2007 |
| JP | 2009-80452 A | 4/2009 |
| JP | 2013-95894 A | 5/2013 |
| JP | 2014-201695 A | 10/2014 |
| KR | 10-2016-0126974 A | 11/2016 |
| KR | 10-2016-0127098 A | 11/2016 |
| TW | 201708957 A | 3/2017 |
| WO | 2007/004569 A1 | 1/2007 |
| WO | 2016/194769 A1 | 12/2016 |
| WO | 2017/002859 A1 | 1/2017 |

OTHER PUBLICATIONS

International Search Report in International Application No. PCT/JP2018/020369, dated Aug. 21, 2018.
Written Opinion in International Application No. PCT/JP2018/020369, dated Aug. 21, 2018.
International Preliminary Report on Patentability (IPRP) with a Translation of Written Opinion in International Application No. PCT/JP2018/020369, dated Dec. 3, 2019.
Extended European Search Report (EESR) dated May 18, 2020, from the European Patent Office in European application No. 18810637.1.
Office Action dated Jun. 9, 2020, from the Japanese Patent Office in Japanese application No. 2019-521207.
Office Action dated Aug. 17, 2021 from the Korean Intellectual Property Office in KR Application No. 10-2019-7034870.

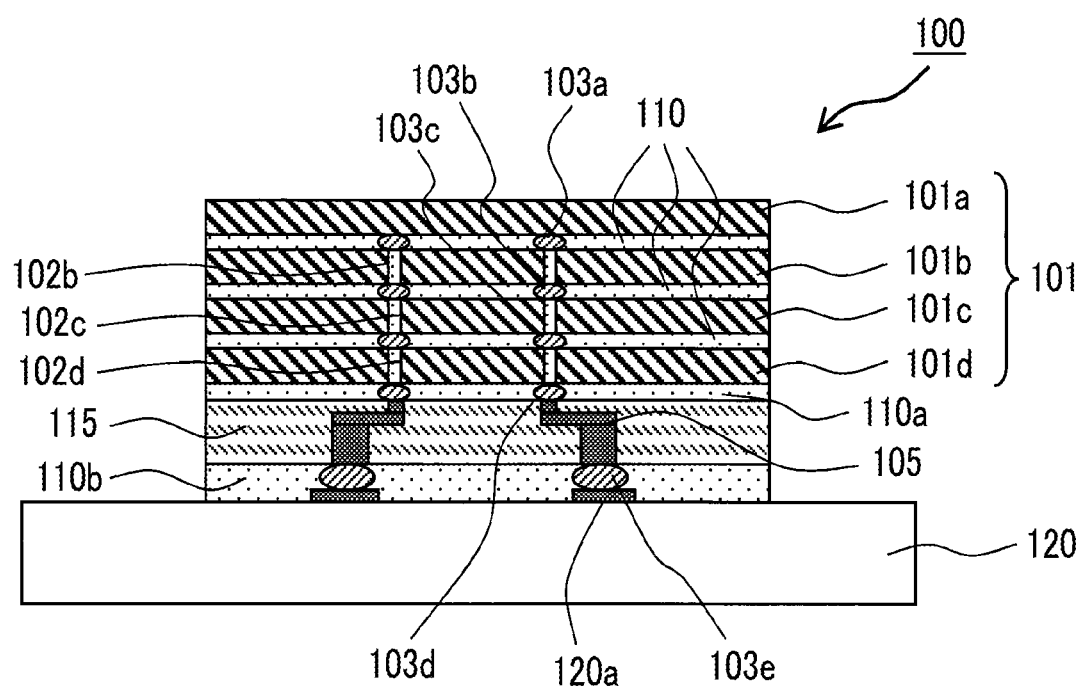

PHOTOSENSITIVE RESIN COMPOSITION, POLYMER PRECURSOR, CURED FILM, LAMINATE, METHOD FOR PRODUCING CURED FILM, AND SEMICONDUCTOR DEVICE

CROSS-REFERENCE TO RELATED APPLICATIONS

This application is a Continuation of PCT International Application No. PCT/JP2018/020369 filed on May 28, 2018, which claims priority under 35 U.S.C § 119(a) to Japanese Patent Application No. 2017-108409 filed on May 31, 2017. Each of the above application(s) is hereby expressly incorporated by reference, in its entirety, into the present application.

BACKGROUND OF THE INVENTION

1. Field of the Invention

The present invention relates to a photosensitive resin composition, a polymer precursor, a cured film, a laminate, a method for producing a cured film, and a semiconductor device.

2. Description of the Related Art

In the related art, a polyimide resin having excellent heat resistance in combination with electrical properties, mechanical properties, and the like is used for a protective film and an interlayer insulating film of a semiconductor element. However, in recent years, while high integration and increase in the size of semiconductor elements have been progressing, there has been a demand for thinning and miniaturization of sealed resin packages, and modes such as surface mounting using a lead-on-chip (LOC) or solder reflow method have been taken.

For manufacturing such semiconductor elements, photosensitivity has been imparted to a polyimide precursor itself, or a photosensitive resin composition which includes a polyimide precursor and a photo-radical polymerizable compound has been used. This is because a pattern forming step can be simplified by using the photosensitive resin composition. For example, JP2014-201695A discloses a negative tone photosensitive resin composition including (A) polyamic acid derivative in which a plurality of structural units represented by:

General Formula (1)

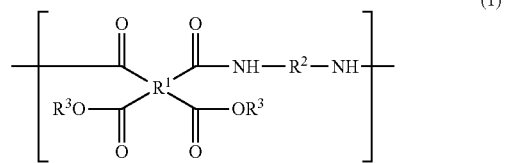

(in the formula, $R^1$ is a tetravalent organic group, $R^2$ is a divalent organic group, and two $R^3$s are independently hydrogen or a monovalent organic group) are included, some of $R^3$s in the plurality of the structural units are hydrogens and others are monovalent organic groups, and (B) compound that generates a basic substance by irradiation.

SUMMARY OF THE INVENTION

However, it has been known that the photosensitive resin composition described above may not have sufficient breaking elongation. In addition, in a case where there is time until use after preparing a photosensitive resin composition, the storage stability of the photosensitive resin composition itself also becomes a problem.

An object of the present invention is to provide a photosensitive resin composition which has high breaking elongation and high excellent storage stability in case of forming a cured film, a polymer precursor, a cured film, a laminate, a method for producing a cured film, and a semiconductor device to solve the problems.

The inventors have studied on the above-mentioned problems and have found that it is possible to improve both breaking elongation of a cured film and storage stability of a photosensitive resin composition by setting an acid value of a polymer precursor used in a photosensitive resin composition within a predetermined range.

Specifically, the above problems have been solved by the following means <1>, and preferably <2> to <26>.

<1> A photosensitive resin composition comprising a polymer precursor selected from a polyimide precursor and a polybenzoxazole precursor; a photo-radical polymerization initiator; and a solvent, in which an acid value of an acid group contained in the polymer precursor and having a neutralization point in a pH range of 7.0 to 12.0 is in the range of 2.5 to 34.0 mgKOH/g, and either the polymer precursor contains a radically polymerizable group or the photosensitive resin composition includes a radically polymerizable compound other than the polymer precursor.

<2> The photosensitive resin composition according to <1>, in which the acid value of the acid group contained in the polymer precursor and having a neutralization point in a pH range of 7.0 to 12.0 is in the range of 5.5 to 17.0 mgKOH/g.

<3> The photosensitive resin composition according to <1> or <2>, in which the acid group contained in the polymer precursor and having a neutralization point in a pH range of 7.0 to 12.0 is a carboxyl group.

<3-2> A photosensitive resin composition comprising a polymer precursor selected from a polyimide precursor and a polybenzoxazole precursor; a photo-radical polymerization initiator; and a solvent, in which the polymer precursor contains a carboxyl group, and either the polymer precursor contains a radically polymerizable group or the photosensitive resin composition includes a radically polymerizable compound other than the polymer precursor.

<4> The photosensitive resin composition according to any one of <1> to <3-2>, in which the polymer precursor contains a repeating unit represented by Formula (1) or a repeating unit represented by Formula (2), Formula (1)

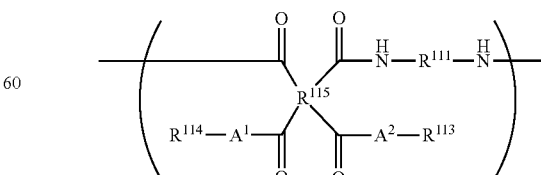

in Formula (1), $A^1$ and $A^2$ each independently represent an oxygen atom or NH, $R^{111}$ represents a divalent organic group, $R^{115}$ represents a tetravalent organic group, and $R^{113}$ and $R^{114}$ each independently represent a hydrogen atom or a monovalent organic group;

Formula (2)

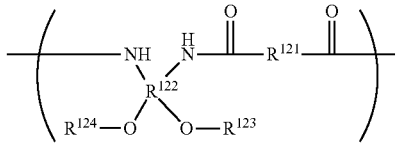

in Formula (2), $R^{121}$ represents a divalent organic group, $R^{122}$ represents a tetravalent organic group, and $R^{123}$ and $R^{124}$ each independently represent a hydrogen atom or a monovalent organic group;

at least one of the repeating units represented by Formula (1) is a repeating unit in which at least one of —C(=O)$A^2$-$R^{113}$ or —C(=O)$A^1$-$R^{114}$ contains an acid group having a neutralization point in a pH range of 7.0 to 12.0, and at least one of the repeating units represented by Formula (2) is a repeating unit in which at least one of —$R^{122}$—O—$R^{123}$ or —$R^{122}$—O—$R^{124}$ contains the acid group having a neutralization point in a pH range of 7.0 to 12.0.

<5> The photosensitive resin composition according to <4>, in which at least one of the repeating units represented by Formula (1) is a repeating unit in which at least one of $R^{113}$ or $R^{114}$ contains a radically polymerizable group, or at least one of the repeating units represented by Formula (2) is a repeating unit in which at least one of $R^{123}$ or $R^{124}$ contains a radically polymerizable group.

<6> The photosensitive resin composition according to <4> or <5>, in which the polymer precursor contains the repeating unit represented by Formula (1).

<7> The photosensitive resin composition according to any one of <1> to <6>, further comprising a radically polymerizable compound other than the polymer precursor.

<8> The photosensitive resin composition according to any one of <1> to <7>, further comprising a thermal-base generator.

<9> The photosensitive resin composition according to any one of <1> to <8>, further comprising a photo-base generator.

<10> The photosensitive resin composition according to any one of <1> to <9>, further comprising a polymerization inhibitor.

<11> The photosensitive resin composition according to any one of <1> or <9>, which is used for development using a developer which includes an organic solvent.

<12> The photosensitive resin composition according to <11>, in which 50% by mass or more of the developer is an organic solvent.

<13> The photosensitive resin composition according to <11> or <12>, in which the developer includes an organic solvent having a Clog P of −1 to 5.

<14> The photosensitive resin composition according to any one of <1> to <13>, which is used for forming an interlayer insulating film for a re-distribution layer.

<15> A polymer precursor comprising a repeating unit represented by Formula (1) or a repeating unit represented by Formula (2);

Formula (1)

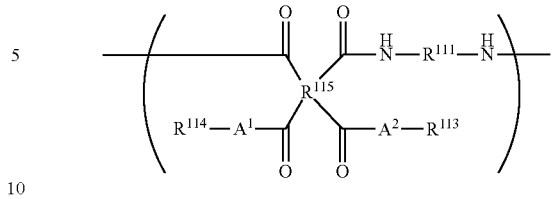

in Formula (1), $A^1$ and $A^2$ each independently represent an oxygen atom or NH, $R^{111}$ represents a divalent organic group, $R^{115}$ represents a tetravalent organic group, and $R^{113}$ and $R^{114}$ each independently represent a hydrogen atom or a monovalent organic group;

Formula (2)

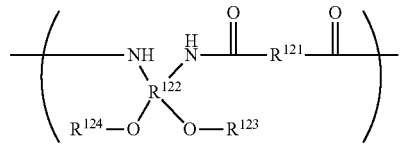

in Formula (2), $R^{121}$ represents a divalent organic group, $R^{122}$ represents a tetravalent organic group, and $R^{123}$ and $R^{124}$ each independently represent a hydrogen atom or a monovalent organic group;

at least one of the repeating units represented by Formula (1) is a repeating unit in which at least one of —C(=O)$A^2$-$R^{113}$ or —C(=O)$A^1$-$R^{114}$ contains an acid group having a neutralization point in a pH range of 7.0 to 12.0, and at least one of the repeating units represented by Formula (2) is a repeating unit in which at least one of —$R^{122}$—O—$R^{123}$ or —$R^{122}$—O—$R^{124}$ contains an acid group having a neutralization point in a pH range of 7.0 to 12.0.

<16> The polymer precursor according to <15>, in which an acid value of the acid group having a neutralization point in a pH range of 7.0 to 12.0 is in the range of 5.5 to 17.0 mgKOH/g.

<17> The polymer precursor according to <15> or <16>, in which at least one of the repeating units represented by Formula (1) is a repeating unit in which at least one of $R^{113}$ or $R^{114}$ contains a radically polymerizable group, or at least one of the repeating units represented by Formula (2) is a repeating unit in which at least one of $R^{123}$ or $R^{124}$ contains a radically polymerizable group.

<18> A cured film formed from the photosensitive resin composition according to any one of <1> to <14>.

<19> A laminate comprising two or more cured films according to <18>.

<20> The laminate according to <19>, further comprising a metal layer between the cured films.

<21> A method for producing a cured film, comprising using the photosensitive resin composition according to any one of <1> to <14>.

<22> The method for producing a cured film according to <21>, comprising: a photosensitive resin composition layer forming step of applying the photosensitive resin composition to a substrate to form a layer; an exposure step of exposing the photosensitive resin composition layer; and a development treatment step of performing a development treatment for the exposed photosensitive resin composition layer.

<23> The method for producing a cured film according to <22>, in which a step of heating at 40° C. or more is not included between the exposure step and the development treatment step.

<24> The method for producing a cured film according to <22> or <23>, in which the development treatment is performed using a developer which includes 50% by mass or more of an organic solvent.

<25> The method for producing a cured film according to any one of <21> to <24>, in which the development treatment is performed using a developer which includes an organic solvent having a Clog P of −1 to 5.

<26> A semiconductor device comprising the cured film according to <18> or the laminate according to <19> or <20>.

According to the present invention, it is possible to provide a photosensitive resin composition which has high breaking elongation and high excellent storage stability in case of forming a cured film, a polymer precursor, a cured film, a laminate, a method for producing a cured film, and a semiconductor device to solve the problems.

BRIEF DESCRIPTION OF THE DRAWINGS

FIG. 1 is a schematic diagram showing the configuration of an embodiment of a semiconductor device.

DESCRIPTION OF THE PREFERRED EMBODIMENTS

Hereinafter, the contents of the present invention are described in detail. In the present specification, a numerical range expressed using "to" means a range including numerical values described before and after the preposition "to" as a lower limit value and an upper limit value.

The following description of constituent elements in the present invention may be made based on representative embodiments of the present invention. However, the present invention is not limited to such embodiments.

In describing a group (atomic group) in the present specification, a description having no indication about substitution and non-substitution includes a description having a substituent as well as a description having no substituent. For example, "alkyl group" includes not only an alkyl group (unsubstituted alkyl group) having no substituent but also an alkyl group (substituted alkyl group) having a substituent.

In the present specification, unless otherwise specified, "exposure" includes not only exposure using light but also lithography with particle beams such as electron beams and ion beams. In addition, as light used for exposure, generally, actinic rays or radiations such as a bright line spectrum of a mercury lamp, far ultraviolet rays typified by excimer laser, extreme ultraviolet rays (EUV light), X-rays, and electron beams are mentioned.

In the present specification, a numerical range expressed using "to" means a range including numerical values described before and after the preposition "to" as a lower limit value and an upper limit value.

In the present specification, "(meth)acrylate" represents either or both of "acrylate" and "methacrylate", "(meth)acryl" means either or both of "acryl" and "methacryl", and "(meth)acryloyl" represents either or both of "acryloyl" and "methacryloyl".

In the present specification, the term "step" not only includes an independent step, but also steps in a case where an intended action of the step is achieved even though it is not possible to make a clear distinction from the other step.

In the present specification, a solid content is a mass percentage of other components excluding a solvent with respect to a total mass of a composition. In addition, the concentration of solid contents refers to a concentration at 25° C. unless otherwise stated.

In the present specification, unless otherwise stated, weight-average molecular weight (Mw) and number-average molecular weight (Mn) are defined as polystyrene equivalent values according to gel permeation chromatography (GPC measurement). In the present specification, the weight-average molecular weight (Mw) and the number-average molecular weight (Mn) can be obtained, for example, by using HLC-8220 (manufactured by Tosoh Corporation) and using, as a column, GUARD COLUMN HZ-L, TSK gel Super HZM-M, TSK gel Super HZ4000, TSK gel Super HZ3000, TSK gel Super HZ2000 (manufactured by Tosoh Corporation). Unless otherwise stated, measurement is performed using tetrahydrofuran (THF) as an eluent. In addition, unless otherwise stated, detection is made using a detector having an ultraviolet ray (UV ray) wavelength of 254 nm.

<Photosensitive Resin Composition>

A photosensitive resin composition according to the embodiment of the present invention (hereinafter, sometimes simply referred to as "composition according to the embodiment of the present invention") includes a polymer precursor selected from a polyimide precursor and a polybenzoxazole precursor; a photo-radical polymerization initiator; and a solvent, in which an acid value of an acid group contained in the polymer precursor and having a neutralization point in a pH range of 7.0 to 12.0 is in the range of 2.5 to 34.0 mgKOH/g, and either the polymer precursor contains a radically polymerizable group or the photosensitive resin composition includes a radically polymerizable compound other than the polymer precursor. With this constitution, it is possible to obtain a photosensitive resin composition which has high breaking elongation and high excellent storage stability in case of forming a cured film. That is, by setting an acid value of a polymer precursor within a predetermined range and by performing curing through radical polymerization by mixing a radical polymerization initiator, it is possible to improve both the breaking elongation of a cured film obtained and the storage stability of a photosensitive resin composition. Particularly, the presence of a small amount of acid groups in the polymer precursor can increase the hydrogen bonding property of the polymer precursor and improve the durability to external force. Furthermore, since flexibility against external force increases due to the appropriate presence of a radically polymerized product produced by the radical polymerization initiator, it is anticipated that the breaking elongation of the cured film after radical polymerization is improved. Moreover, the photosensitive resin composition can have excellent storage stability by causing the quantity of the acid group which is included in the polymer precursor to be a certain quantity or less.

<<Polymer Precursor>>

A photosensitive resin composition according to the embodiment of the present invention contains at least one type of polymer precursor. The polymer precursor preferably includes a polyimide precursor or a polybenzoxazole precursor, more preferably a polyimide precursor, and still more preferably a polyimide precursor including a repeating unit represented by Formula (1) described later.

The polymer precursor used in the present invention has an acid value of an acid group having a neutralization point in a pH range of 7.0 to 12.0 in the range of 2.5 to 34.0 mgKOH/g, more preferably 5.5 mgKOH/g or more, and still more preferably 6.0 mgKOH/g or more, and preferably has in the range of 17.0 mgKOH/g or less, and more preferably in the range of 12.0 mgKOH/g or less.

In the photosensitive resin composition according to the embodiment of the present invention, an acid value of each of polymer precursors included in the polymer precursor which is contained in the composition may be outside the range of 2.5 to 34.0 mgKOH/g in a case where an acid value of the whole polymer precursors contained in the composition is in the range of 2.5 to 34.0 mgKOH/g.

Specifically, two or more polymer precursors outside the range of 2.5 to 34.0 mgKOH/g may be blended to adjust an acid value of the whole polymer precursor contained in the composition in the range of 2.5 to 34.0 mgKOH/g.

In the photosensitive resin composition according to the embodiment of the present invention, among the polymer precursor contained in the composition, preferably 70% by mass or more, more preferably 80% by mass or more, and still more preferably 90% by mass or more have an acid value in the range of 2.5 to 34.0 mgKOH/g (preferably in the range of 5.5 to 17.0 mgKOH/g, and more preferably in the range of 6.0 to 12.0 mgKOH/g).

In a case where the photosensitive resin composition according to the embodiment of the present invention contains two or more polymer precursors, the acid value is calculated according to the mass ratio of each of the polymer precursors.

The acid group contained in the polymer precursor and having a neutralization point in a pH range of 7.0 to 12.0 means an acid group having a neutralization point in a pH range of 7.0 to 12.0 in an acid value measurement method described in examples to be described later, and a carboxyl group is exemplified.

The polymer precursor contained in the composition according to the embodiment of the present invention may or may not contain an acid group other than an acid group in a pH range of 7.0 to 12.0. Among the acid groups contained in the polymer precursor contained in the composition according to the embodiment of the present invention, preferably 70 mol % or more, more preferably 80 mol % or more, and still more preferably 90 mol % or more are acid groups in a pH range of 7.0 to 12.0.

The acid group in a pH range of 7.0 to 12.0 may be bonded to a side chain of the polymer precursor or may be bonded to the main chain. An embodiment in which the acid group is bonded to at least the side chain of the polymer precursor is preferred.

A neutralization point is measured using sodium hydroxide as a base. In addition, in a case where measurement of a neutralization point using sodium hydroxide is difficult, a neutralization point which is measured using calcium hydroxide and converted into sodium hydroxide equivalent is also considered to be measured using sodium hydroxide.

The acid value within the above range can be achieved by appropriately adjusting reaction conditions.

In the present invention, it is preferable to produce the polymer precursor using a synthesis reaction solution having a water content of 50 to 700 ppm by mass. With this constitution, a polymer precursor which satisfies a predetermined acid value can be obtained more easily.

A water content of the synthesis reaction solution of the polymer precursor of the embodiment of the present invention is measured by a method described later in examples.

<<<Polyimide Precursor>>>

A type and the like of the polyimide precursor used in the present invention are not particularly specified, and it is preferable to contain a repeating unit represented by Formula (1).

Formula (1)

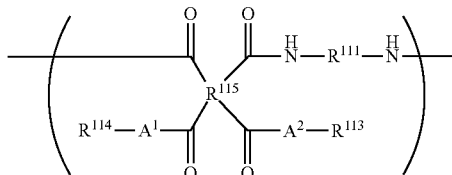

In Formula (1), $A^1$ and $A^2$ each independently represent an oxygen atom or NH, $R^{111}$ represents a divalent organic group, $R^{115}$ represents a tetravalent organic group, and $R^{113}$ and $R^{114}$ each independently represent a hydrogen atom or a monovalent organic group.

In Formula (1), $A^1$ and $A^2$ are preferably an oxygen atom or NH, and more preferably an oxygen atom.

$R^{111}$ in Formula (1) represents a divalent organic group. As the divalent organic group, a linear or branched aliphatic group, a cyclic aliphatic group, and a group containing an aromatic group are exemplified. The divalent organic group is preferably a linear aliphatic group having 2 to 20 carbon atoms, a branched aliphatic group having 3 to 20 carbon atoms, a cyclic aliphatic group having 3 to 20 carbon atoms, an aromatic group having 6 to 20 carbon atoms, or a group consisting of a combination thereof, and is more preferably a group consisting of an aromatic group having 6 to 20 carbon atoms.

$R^{111}$ is preferably derived from diamine. As the diamine used for producing the polyimide precursor, linear or branched aliphatic diamine, cyclic aliphatic, or aromatic diamine, or the like is mentioned. For diamine, only one type may be used, or two or more types may be used.

Specifically, diamine containing a linear aliphatic group having 2 to 20 carbon atoms, a branched or a cyclic aliphatic group having 3 to 20 carbon atoms, an aromatic group having 6 to 20 carbon atoms, or a group consisting of a combination thereof is preferable, and diamine containing a group consisting of an aromatic group having 6 to 20 carbon atoms is more preferable. Examples of the aromatic group include the following.

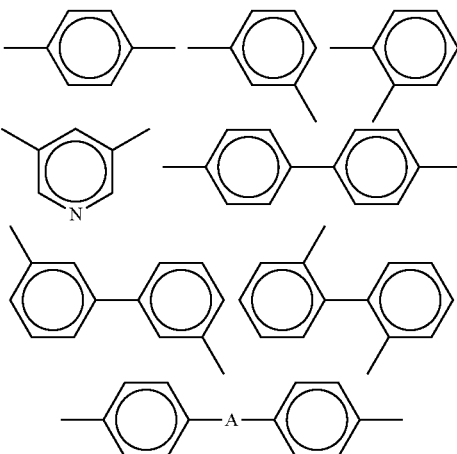

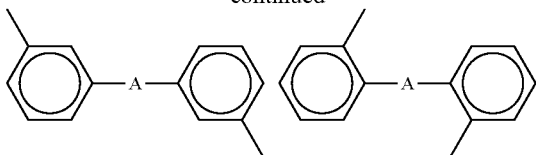

In the formulae, A is preferably a single bond, or a group selected from an aliphatic hydrocarbon group having 1 to 10 carbon atoms which may be substituted with a fluorine atom, —O—, —C(=O)—, —S—, —S(=O)₂—, —NHCO—, and a combination thereof, more preferably a single bond, or a group selected from an alkylene group having 1 to 3 carbon atoms which may be substituted with a fluorine atom, —O—, —C(=O)—, —S—, and —SO₂—, and still more preferably a divalent group selected from the group consisting of —CH₂—, —O—, —S—, —SO₂—, —C(CF₃)₂—, and —C(CH₃)₂—.

As diamine, specifically, at least one diamine selected from 1,2-diaminoethane, 1,2-diaminopropane, 1,3-diaminopropane, 1,4-diaminobutane, and 1,6-diaminohexane; 1,2- or 1,3-diaminocyclopentane, 1,2-, 1,3-, or 1,4-diaminocyclohexane, 1,2-, 1,3-, or 1,4-bis(aminomethyl)cyclohexane, bis-(4-aminocyclohexyl)methane, bis-(3-aminocyclohexyl)methane, 4,4'-diamino-3,3'-dimethylcyclohexylmethane, and isophorone diamine; meta- and paraphenylene diamine, diaminotoluene, 4,4'- and 3,3'-diaminobiphenyl, 4,4'-diaminodiphenyl ether, 3,3-diaminodiphenyl ether, 4,4'- and 3,3'-diaminodiphenylmethane, 4,4'- and 3,3'-diaminodiphenyl sulfone, 4,4'- and 3,3'-diaminodiphenyl sulfide, 4,4'- and 3,3'-diaminobenzophenone, 3,3'-dimethyl-4,4'-diaminobiphenyl, 2,2'-dimethyl-4,4'-diaminobiphenyl, 3,3'-dimethoxy-4,4'-diaminobiphenyl, 2,2-bis(4-aminophenyl)propane, 2,2-bis(4-aminophenyl)hexafluoropropane, 2,2-bis(3-hydroxy-4-aminophenyl)propane, 2,2-bis(3-hydroxy-4-aminophenyl)hexafluoropropane, 2,2-bis(3-amino-4-hydroxyphenyl)propane, 2,2-bis(3-amino-4-hydroxyphenyl) hexafluoropropane, bis(3-amino-4-hydroxyphenyl) sulfone, bis(4-amino-3-hydroxyphenyl) sulfone, 4,4'-diaminoparaterphenyl, 4,4-bis(4-aminophenoxy)biphenyl, bis[4-(4-aminophenoxy)phenyl]sulfone, bis[4-(3-aminophenoxy)phenyl]sulfone, bis[4-(2-aminophenoxy)phenyl]sulfone, 1,4-bis(4-aminophenoxy)benzene, 9,10-bis(4-aminophenyl)anthracene, 3,3'-dimethyl-4,4'-diaminodiphenyl sulfone, 1,3-bis(4-aminophenoxy)benzene, 1,3-bis(3-aminophenoxy)benzene, 1,3-bis(4-aminophenyl)benzene, 3,3'-diethyl-4,4'-diaminodiphenylmethane, 3,3'-dimethyl-4,4'-diaminodiphenylmethane, 4,4'-diaminooctafluorobiphenyl, 2,2-bis[4-(4-aminophenoxy)phenyl]propane, 2,2-bis[4-(4-aminophenoxy)phenyl]hexafluoropropane, 9,9-bis(4-aminophenyl)-10-hydroanthracene, 3,3',4,4'-tetraaminobiphenyl, 3,3',4,4'-tetraaminodiphenyl ether, 1,4-diaminoanthraquinone, 1,5-diaminoanthraquinone, 3,3-dihydroxy-4,4'-diaminobiphenyl, 9,9'-bis(4-aminophenyl)fluorene, 4,4'-dimethyl-3,3'-diaminodiphenyl sulfone, 3,3',5,5'-tetramethyl-4,4'-diaminodiphenylmethane, 2,4- and 2,5-diaminocumene, 2,5-dimethyl-paraphenylene diamine, acetoguanamine, 2,3,5,6-tetramethyl-paraphenylene diamine, 2,4,6-trimethyl-metaphenylene diamine, bis(3-aminopropyl)tetramethyldisiloxane, 2,7-diaminofluorene, 2,5-diaminopyridine, 1,2-bis(4-aminophenyl)ethane, diaminobenzanilide, esters of diaminobenzoic acid, 1,5-diaminonaphthalene, diaminobenzotrifluoride, 1,3-bis(4-aminophenyl)hexafluoropropane, 1,4-bis(4-aminophenyl)octafluorobutane, 1,5-bis(4-aminophenyl)decafluoropentane, 1,7-bis(4-aminophenyl)tetradecafluoroheptane, 2,2-bis[4-(3-aminophenoxy)phenyl]hexafluoropropane, 2,2-bis[4-(2-aminophenoxy)phenyl]hexafluoropropane, 2,2-bis[4-(4-aminophenoxy)-3,5-dimethylphenyl]hexafluoropropane, 2,2-bis[4-(4-amino phenoxy)-3,5-bis(trifluoromethyl)phenyl]hexafluoropropane, parabis(4-amino-2-trifluoromethylphenoxy)benzene, 4,4'-bis(4-amino-2-trifluoromethylphenoxy)biphenyl, 4,4'-bis(4-amino-3-trifluoromethylphenoxy)biphenyl, 4,4'-bis(4-amino-2-trifluoromethylphenoxy)diphenyl sulfone, 4,4'-bis(3-amino-5-trifluoromethylphenoxy)diphenyl sulfone, 2,2-bis[4-(4-amino-3-trifluoromethylphenoxy)phenyl] hexafluoropropane, 3,3',5,5'-tetramethyl-4,4'-diaminobiphenyl, 4,4'-diamino-2,2'-bis(trifluoromethyl)biphenyl, 2,2',5,5',6,6'-hexafluorotolidine, or 4,4'-diaminoquaterphenyl is mentioned.

In addition, diamines (DA-1) to (DA-18) as shown below are also preferable.

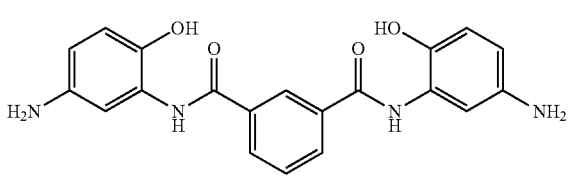
(DA-1)

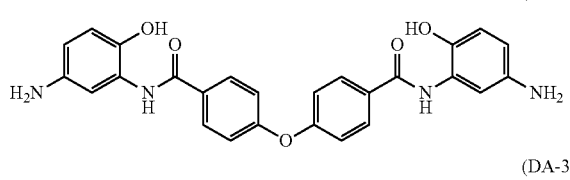
(DA-2)

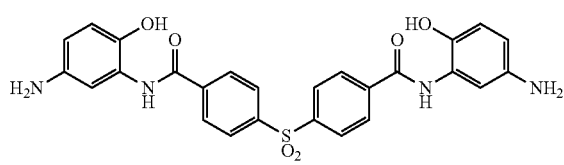
(DA-3)

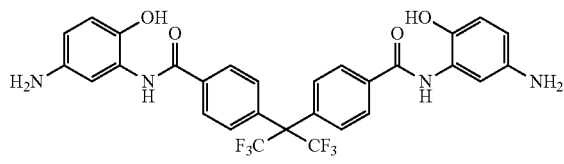
(DA-4)

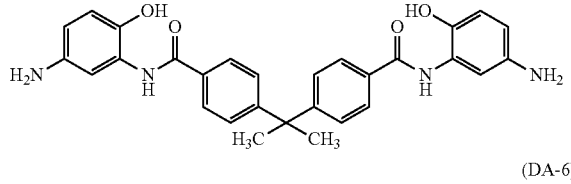
(DA-5)

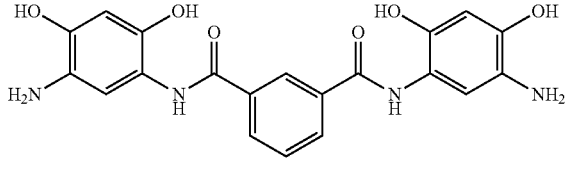
(DA-6)

-continued

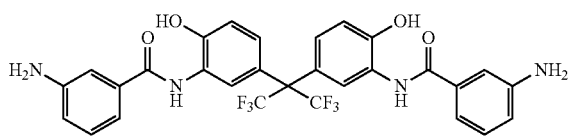
(DA-7)

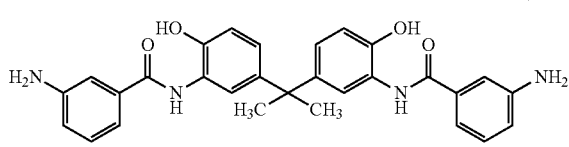
(DA-8)

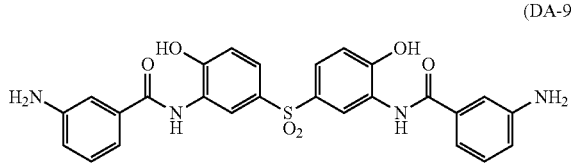
(DA-9)

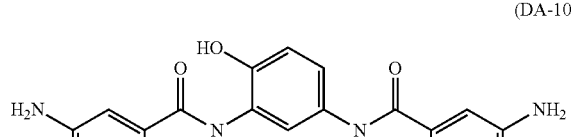
(DA-10)

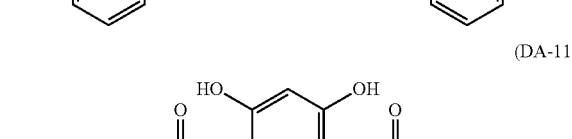
(DA-11)

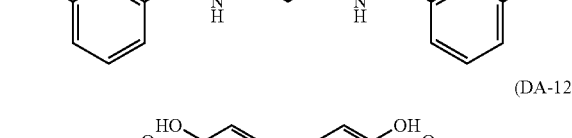
(DA-12)

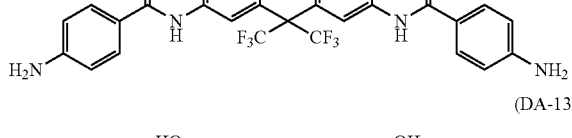
(DA-13)

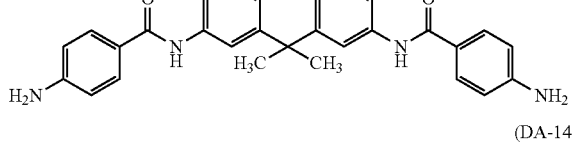
(DA-14)

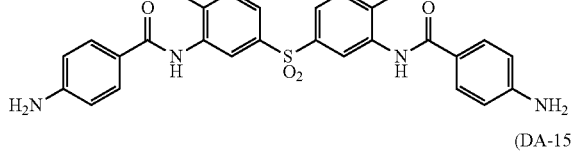
(DA-15)

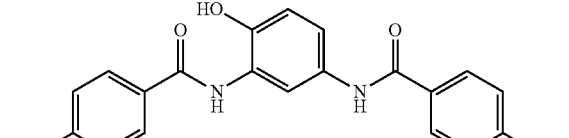

-continued

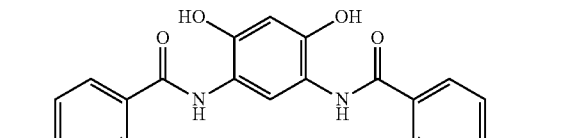
(DA-16)

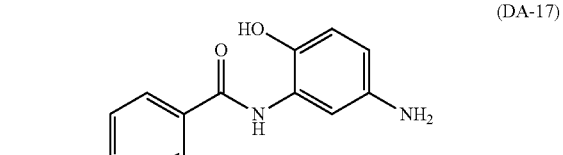
(DA-17)

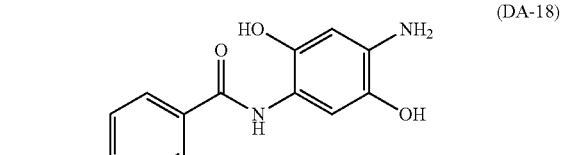
(DA-18)

In addition, as preferable examples of the diamine, diamines having at least two or more alkylene glycol units in a main chain are also mentioned. Diamines containing two or more in total of either or both of ethylene glycol chain and propylene glycol chain in one molecule are preferable, and diamines containing no aromatic ring are more preferable. As specific examples thereof, JEFFAMINE (registered trademark) KH-511, JEFFAMINE (registered trademark) ED-600, JEFFAMINE (registered trademark) ED-900, JEFFAMINE (registered trademark) ED-2003, JEFFAMINE (registered trademark) EDR-148, JEFFAMINE (registered trademark) EDR-176, D-200, D-400, D-2000, D-4000 (all trade names, manufactured by Huntsman Corporation), 1-(2-(2-(2-aminopropoxy)ethoxy)propoxy)propane-2-amine, and 1-(1-(1-(2-aminopropoxy)propane-2-yl)oxy)propane-2-amine are mentioned, but not limited thereto.

Structures of JEFFAMINE (registered trademark) KH-511, JEFFAMINE (registered trademark) ED-600, JEFFAMINE (registered trademark) ED-900, JEFFAMINE (registered trademark) ED-2003, JEFFAMINE (registered trademark) EDR-148, and JEFFAMINE (registered trademark) EDR-176 are shown below.

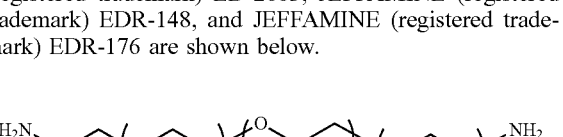

KH-511 (y = 2.0, x + z = 1.2)
ED-600 (y = 9.0, x + z = 3.6)
ED-900 (y = 12.5, x + z = 6.0)
ED-2003 (y = 39.0, x + z = 6.0)

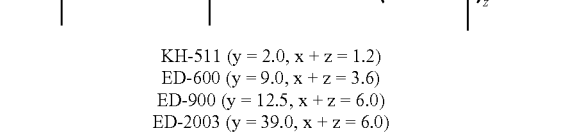
EDR-148

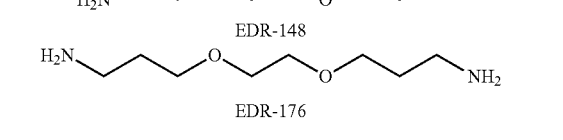
EDR-176

In the above, x, y, and z are average values.

$R^{111}$ is preferably represented by —Ar-L-Ar— from the viewpoint of flexibility of an obtained cured film. However, Ar's are each independently an aromatic hydrocarbon group, and L is an aliphatic hydrocarbon group having 1 to 10 carbon atoms which may be substituted with a fluorine atom, —O—, —CO—, —S—, —SO$_2$— or —NHCO—, and a group consisting of a combination of the two or more thereof. Ar is preferably a phenylene group, and L is more preferably an aliphatic hydrocarbon group having 1 or 2 carbon atoms which may be substituted with a fluorine atom, —O—, —CO—, —S—, or —SO$_2$—. The aliphatic hydrocarbon group herein is preferably an alkylene group.

From the viewpoint of i-ray transmittance, $R^{111}$ is preferably a divalent organic group represented by Formula (51) or Formula (61) below. In particular, from the viewpoint of i-ray transmittance and ease of availability, a divalent organic group represented by Formula (61) is more preferable.

Formula (51)

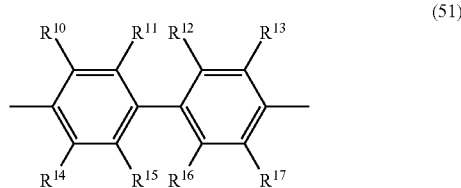

(51)

In Formula (51), $R^{10}$ to $R^{17}$ each independently represent a hydrogen atom, a fluorine atom, or a monovalent organic group, and at least one of $R^{10}$, ..., or $R^{17}$ represents a fluorine atom, a methyl group, a fluoromethyl group, a difluoromethyl group, or a trifluoromethyl group.

In a case where $R^{10}$ to $R^{17}$ are monovalent organic groups, an unsubstituted alkyl group having 1 to 10 (preferably 1 to 6) carbon atoms, a fluorinated alkyl group having 1 to 10 (preferably 1 to 6) carbon atoms, and the like are mentioned.

Formula (61)

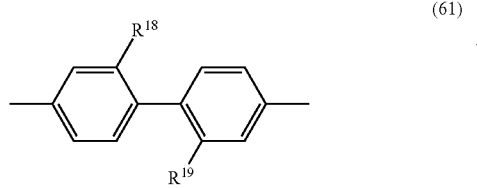

(61)

In Formula (61), $R^{18}$ and $R^{19}$ each independently represent a fluorine atom, a fluoromethyl group, a difluoromethyl group, or a trifluoromethyl group.

As a diamine compound that forms a structure of Formula (51) or (61), dimethyl-4,4'-diaminobiphenyl, 2,2'-bis(trifluoromethyl)-4,4'-diaminobiphenyl, 2,2'-bis(fluoro)-4,4'-diaminobiphenyl, 4,4'-diaminooctafluorobiphenyl, and the like are mentioned. One type of these may be used, or two or more types thereof may be used in combination.

$R^{115}$ in Formula (1) represents a tetravalent organic group. As the tetravalent organic group, a tetravalent organic group containing an aromatic ring is preferable, and a group represented by Formula (5) or Formula (6) is more preferable.

Formula (5)

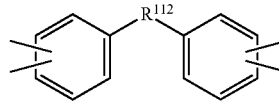

In Formula (5), $R^{112}$ is preferably a single bond, or a group selected from an aliphatic hydrocarbon group having 1 to 10 carbon atoms which may be substituted with a fluorine atom, —O—, —CO—, —S—, —SO$_2$—, —NHCO—, and a combination thereof, more preferably a single bond, or a group selected from an alkylene group having 1 to 3 carbon atoms which may be substituted with a fluorine atom, —O—, —CO—, —S—, and —SO$_2$—, and still more preferably a divalent group selected from the group consisting of —CH$_2$—, —C(CF$_3$)$_2$—, —C(CH$_3$)$_2$—, —O—, —CO—, —S—, and —SO$_2$—.

Formula (6)

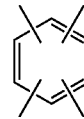

As the tetravalent organic group represented by $R^{115}$ in Formula (1), specifically, a tetracarboxylic acid residue that remains after removing an acid dianhydride group from tetracarboxylic acid dianhydride is mentioned. For the tetracarboxylic acid dianhydride, only one type may be used, or two or more types may be used. The tetracarboxylic acid dianhydride is preferably a compound represented by Formula (O).

Formula (O)

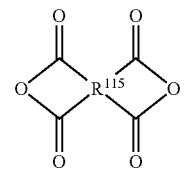

In Formula (O), $R^{115}$ represents a tetravalent organic group. $R^{115}$ has the same meaning as $R^{115}$ in Formula (1).

As specific examples of the tetracarboxylic acid dianhydride, at least one type selected from pyromellitic acid, pyromellitic acid dianhydride (PMDA), 3,3',4,4'-biphenyltetracarboxylic acid dianhydride, 3,3',4,4'-diphenylsulfide tetracarboxylic acid dianhydride, 3,3',4,4'-diphenylsulfone tetracarboxylic acid dianhydride, 3,3',4,4'-benzophenone tetracarboxylic acid dianhydride, 3,3',4,4'-diphenylmethane tetracarboxylic acid dianhydride, 2,2',3,3'-diphenylmethane tetracarboxylic acid dianhydride, 2,3,3',4'-biphenyltetracarboxylic acid dianhydride, 2,3,3',4'-benzophenone tetracarboxylic acid dianhydride, 4,4'-oxydiphthalic acid dianhydride, 2,3,6,7-naphthalene tetracarboxylic acid dianhydride, 1,4,5,7-naphthalene tetracarboxylic acid dianhydride, 2,2-bis(3,4-dicarboxyphenyl) propane dianhydride, 2,2-bis(2,3-dicarboxyphenyl)propane dianhydride, 2,2-bis(3,4-dicarboxyphenyl) hexafluoropropane dianhydride, 1,3-diphenylhexafluoropropane-3,3,4,4- tetracarboxylic acid dianhydride, 1,4,5,6-naphthalene tetracarboxylic acid dianhydride, 2,2',3,3'-diphenyl tetracarboxylic acid dianhydride, 3,4,9,10-perylene tetracarboxylic acid dianhydride, 1,2,4,5-naphthalene tetracarboxylic acid dianhydride, 1,4,5,8-naphthalene tetracarboxylic acid dianhydride, 1,8,9,10-phenanthrene tetracarboxylic acid dianhydride, 1,1-bis(2,3-dicarboxyphenyl)ethane dianhydride, 1,1-bis(3,4-dicarboxyphenyl)ethane dianhydride, 1,2,3,4-benzene tetracarboxylic acid dianhydride, or alkyl derivatives having 1 to 6 carbon atoms and/or alkoxy derivatives having 1 to 6 carbon atoms thereof are exemplified.

In addition, tetracarboxylic acid dianhydrides (DAA-1) to (DAA-5) as shown below are also mentioned as preferable examples.

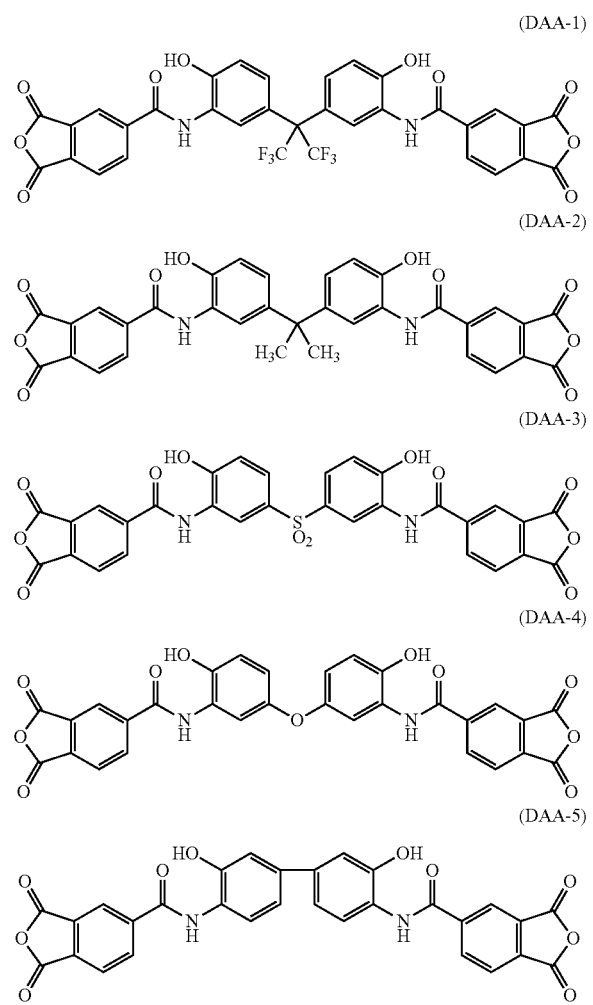

In Formula (1), $R^{113}$ and $R^{114}$ each independently represent a hydrogen atom or a monovalent organic group.

In the present invention, at least one of the repeating units represented by Formula (1) is preferably a repeating unit in which at least one of —C(=O)$A^2$-$R^{113}$ or —C(=O)$A^1$-$R^{114}$ contains an acid group having a neutralization point in a pH range of 7.0 to 12.0. Specific examples include a case where $R^{113}$ and $R^{114}$ contain an acid group, and a case where —C(=O)$A^2$-$R^{113}$ and —C(=O)$A^1$-$R^{114}$ are —COOH, and a case where —C(=O)$A^2$-$R^{113}$ and —C(=O)$A^1$-$R^{114}$ are —COOH is preferred.

In the present invention, it is preferable that at least one of the repeating units represented by Formula (1) is a repeating unit in which at least one of $R^{113}$ or $R^{114}$ contains a radically polymerizable group. The radically polymerizable group is a group capable of undergoing a crosslinking reaction by an action of a radical, and preferable examples thereof include a group having an ethylenically unsaturated bond.

Preferable examples of the polyimide precursor used in the present invention include: an embodiment in which both a repeating unit (1A) in which at least one (preferably both) of —C(=O)$A^2$-$R^{113}$ or —C(=O)$A^1$-$R^{114}$ contains an acid group having a neutralization point in a pH range of 7.0 to 12.0 and a repeating unit (1B) in which at least one (preferably both) of $R^{113}$ or $R^{114}$ contains a radically polymerizable group are contained; an embodiment in which a repeating unit (1C) in which one of —C(=O)$A^2$-$R^{113}$ and —C(=O)$A^1$-$R^{114}$ contains an acid group having a neutralization point in a pH range of 7.0 to 12.0, and one of $R^{113}$ and $R^{114}$ (one not containing an acid group) contains a radically polymerizable group is contained; and an embodiment in which at least one of the repeating unit (1A) or the repeating unit (1B) and the repeating unit (1C) are contained.

In the present invention, the molar ratio of the repeating unit (1A) to the repeating unit (1B) is preferably 99:1 to 80:20, and more preferably 98:2 to 90:10.

In the present invention, the total amount of the repeating unit (1A), the repeating unit (1B) and the repeating unit (1C) is preferably 80 mol % or more, more preferably 90 mol % or more, and still more preferably 95 mol % or more of all the repeating units of the polyimide precursor.

In addition, in the present invention, a ratio of the number of radically polymerizable groups contained in the polyimide precursor to the number of acid groups in a pH range of 7.0 to 12.0 is preferably 80:20 to 99:1, and more preferably 90:10 to 98:2.

Examples of the groups having an ethylenically unsaturated bond include a vinyl group, a (meth)allyl group, and a group represented by Formula (III), a (meth)acryl group is preferred, and a (meth)acryloyloxy group is more preferred.

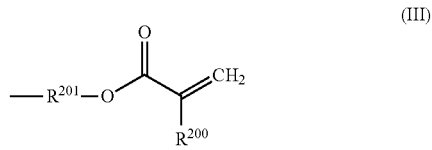

In Formula (III), $R^{200}$ represents a hydrogen atom or a methyl group, with a methyl group being more preferable.

In Formula (III), $R^{201}$ represents an alkylene group having 2 to 12 carbon atoms, —CH$_2$CH(OH)CH$_2$—, or a polyoxyalkylene group having 4 to 30 carbon atoms.

Suitable examples of $R^{201}$ include an ethylene group, a propylene group, a trimethylene group, a tetramethylene group, a 1,2-butanediyl group, a 1,3-butanediyl group, a pentamethylene group, a hexamethylene group, an octamethylene group, a dodecamethylene group, and —CH$_2$CH(OH)CH$_2$—, with an ethylene group, a propylene group, a trimethylene group, and —CH$_2$CH(OH)CH$_2$— being more preferable.

Particularly preferably, $R^{200}$ is a methyl group, and $R^{201}$ is an ethylene group.

As the monovalent organic group represented by $R^{113}$ or $R^{114}$, an organic group that improves solubility of a developer is preferably used.

In a case where $R^{113}$ or $R^{114}$ is a monovalent organic group, an aromatic group, an aralkyl group and the like, which include one, two or three, preferably one acid group that is bonded to a carbon constituting an aryl group are mentioned. Specifically, an aromatic group having 6 to 20 carbon atoms which has an acid group and an aralkyl group having 7 to 25 carbon atoms which has an acid group are mentioned. More specifically, a phenyl group having an acid group and a benzyl group having an acid group can be mentioned. The acid group is preferably an OH group.

$R^{113}$ or $R^{114}$ is more preferably a hydrogen atom, 2-hydroxybenzyl, 3-hydroxybenzyl, and 4-hydroxybenzyl from the viewpoint of solubility in an aqueous developer.

From the viewpoint of solubility in an organic solvent, $R^{113}$ or $R^{114}$ is preferably a monovalent organic group. The monovalent organic group preferably contains a linear or a branched alkyl group, a cyclic alkyl group, or an aromatic group, and more preferably an alkyl group substituted with an aromatic group.

The alkyl group preferably has 1 to 30 carbon atoms. The alkyl group may be linear, branched, or cyclic. As the linear or branched alkyl group, for example, a methyl group, an ethyl group, a propyl group, a butyl group, a pentyl group, a hexyl group, a heptyl group, an octyl group, a nonyl group, a decyl group, a dodecyl group, a tetradecyl group, an octadecyl group, an isopropyl group, an isobutyl group, a sec-butyl group, a tert-butyl group, a 1-ethylpentyl group, and a 2-ethylhexyl group are mentioned. The cyclic alkyl group may be a monocyclic cyclic alkyl group or a polycyclic cyclic alkyl group. As the monocyclic cyclic alkyl group, for example, a cyclopropyl group, a cyclobutyl group, a cyclopentyl group, a cyclohexyl group, a cycloheptyl group, and a cyclooctyl group are mentioned. As the polycyclic cyclic alkyl group, for example, an adamantyl group, a norbornyl group, a bornyl group, a camphenyl group, a decahydronaphthyl group, a tricyclodecanyl group, a tetracyclodecanyl group, a camphoroyl group, a dicyclohexyl group, and a pinenyl group are mentioned. Among these, a cyclohexyl group is most preferable from the viewpoint of compatibility with high sensitivity to exposure. In addition, the alkyl group substituted with an aromatic group is preferably a linear alkyl group substituted with an aromatic group as described later.

As the aromatic group, specifically, a substituted or unsubstituted benzene ring, a naphthalene ring, a pentalene ring, an indene ring, an azulene ring, a heptalene ring, an indacene ring, a perylene ring, a pentacene ring, an acenaphthene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, or a phenazine ring is mentioned. A benzene ring is most preferable.

In Formula (1), in a case where $R^{113}$ is a hydrogen atom, or in a case where $R^{114}$ is a hydrogen atom, the polyimide precursor may form a counter salt with a tertiary amine compound having an ethylenically unsaturated bond. As an example of such a tertiary amine compound having an ethylenically unsaturated bond, N,N-dimethylaminopropyl methacrylate is mentioned.

In addition, it is also preferable that the polyimide precursor has a fluorine atom in a structural unit. A content of fluorine atoms in the polyimide precursor is preferably 10% by mass or higher, and preferably 20% by mass or lower.

In addition, for the purpose of improving adhesiveness to a substrate, an aliphatic group having a siloxane structure may be copolymerized. Specifically, as diamine components, bis(3-aminopropyl)tetramethyldisiloxane, bis(paraaminophenyl)octamethyl pentasiloxane, and the like are mentioned.

The repeating unit represented by Formula (1) is preferably a repeating unit represented by Formula (1-A). That is, at least one type of the polyimide precursor used in the present invention is preferably a precursor having the repeating unit represented by Formula (1-A).

By adopting such a structure, it is possible to further widen a width of exposure latitude.

Formula (1-A)

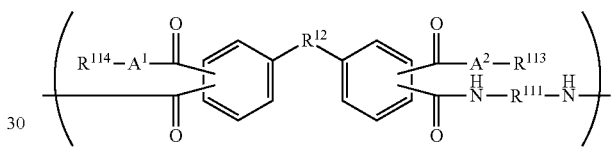

In Formula (1-A), $A^1$ and $A^2$ represent an oxygen atom, $R^{111}$ and $R^{112}$ each independently represent a divalent organic group, and $R^{113}$ and $R^{114}$ each independently represent a hydrogen atom or a monovalent organic group.

$A^1$, $A^2$, $R^{111}$, $R^{113}$ and $R^{114}$ (include —C(=O)A$^2$-R$^{113}$ and —C(=O)A$^1$-R$^{114}$) each independently have the same meanings as $A^1$, $A^2$, $R^{111}$, $R^{113}$ and $R^{114}$ (include —C(=O)A$^2$-R$^{113}$ and —C(=O)A$^1$-R$^{114}$) in Formula (1), and preferred ranges are also the same.

$R^{112}$ has the same meaning as $R^{112}$ in Formula (5), and a preferred range thereof is the same.

In the polyimide precursor, a repeating structural unit represented by Formula (1) may be one type or two or more types. In addition, the polyimide precursor may contain a structural isomer of the repeating unit represented by Formula (1). In addition, the polyimide precursor may also contain other types of repeating structural unit in addition to the repeating unit of Formula (1).

As one embodiment of the polyimide precursor in the present invention, polyimide precursor in which the repeating unit represented by Formula (1) accounts for 50 mol % or higher, even more 70 mol % or higher, particularly 90 mol % or higher in an entirety of the repeating units is exemplified.

A weight-average molecular weight (Mw) of the polyimide precursor is preferably 2,000 to 500,000, more preferably 5,000 to 100,000, and even more preferably 10,000 to 50,000. In addition, a number-average molecular weight (Mn) thereof is preferably 800 to 250,000, more preferably 2,000 to 50,000, and still more preferably 4,000 to 25,000.

The degree of dispersion of the polyimide precursor is preferably 1.5 to 2.5.

The polyimide precursor is obtained by reacting dicarboxylic acid or a dicarboxylic acid derivative with diamine. Preferably, the polyimide precursor is obtained by halogenating dicarboxylic acid or a dicarboxylic acid derivative with a halogenating agent, and then causing the resultant to be reacted with diamine.

In a method for producing the polyimide precursor, it is preferable to use an organic solvent at the time of reaction. One type of organic solvent may be used, or two or more types of organic solvents may be used.

The organic solvent can be appropriately determined according to raw materials, and pyridine, diethylene glycol dimethyl ether (diglyme), N-methylpyrrolidone, and N-ethylpyrrolidone are exemplified.

In the present invention, as described above, the amine value of the polymer precursor is adjusted by adding an amino group to a terminal of a main chain after a dicarboxylic acid or a dicarboxylic acid derivative is reacted with a diamine. As a method of adding an amino group to a terminal of a main chain, a method of adding an amine compound having an amino group or a hydroxyl group to a terminal of a repeating unit derived from a dicarboxylic acid or a dicarboxylic acid derivative is preferable.

As an amine compound having a hydroxyl group, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 2-aminophenol, 3-aminophenol, 4-aminophenol, 2-aminothiophenol, 3-aminothiophenol, 4-aminothiophenol, and the like are mentioned. Two or more of these type may be used, or amine compounds having a plurality of hydroxyl groups may be reacted.

As an amine compound having an amino group, N,N-dimethylethylenediamine, N,N-diethylethylenediamine, 1-(2-aminoethyl) piperidine, and 2-morpholinoethylamine are mentioned. Two or more of these may be used, or an amine compound having a plurality of amino groups may be reacted.

In a case of producing the polyimide precursor, it is preferable to include a step of precipitating a solid. Specifically, the polyimide precursor in a reaction solution is sedimented in water and dissolved in a solvent in which the polyimide precursor such as a tetrahydrofuran and the like can be solubilized, and then the solid can be sedimented.

<<<Polybenzoxazole Precursor>>>

The polybenzoxazole precursor used in the present invention preferably contains a repeating unit represented by Formula (2).

Formula (2)

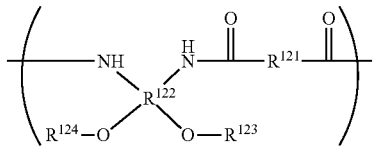

In Formula (2), $R^{121}$ represents a divalent organic group, $R^{122}$ represents a tetravalent organic group, and $R^{123}$ and $R^{124}$ each independently represent a hydrogen atom or a monovalent organic group.

In Formula (2), $R^{121}$ represents a divalent organic group. The divalent organic group is preferably a group containing at least one of an aliphatic group or an aromatic group. The aliphatic group is preferably a linear aliphatic group. $R^{121}$ is preferably derived from 4,4'-oxydibenzoyl chloride and the like.

In Formula (2), $R^{122}$ represents a tetravalent organic group. The tetravalent organic group has the same meaning as $R^{115}$ in Formula (1) described above, and a preferred range thereof is also the same. $R^{122}$ is preferably derived from 2,2'-bis (3-amino-4-hydroxyphenyl) hexafluoropropane and the like.

$R^{123}$ and $R^{124}$ in Formula (2) have the same meaning as $R^{113}$ and $R^{114}$ in Formula (1), and a preferred range thereof is the same. That is, in Formula (2), it is preferable that at least one of $R^{123}$ or $R^{124}$ has a radically polymerizable group.

In the present invention, at least one of the repeating units represented by Formula (2) is preferably a repeating unit in which at least one of —$R^{122}$—O—$R^{123}$ or —$R^{122}$—O—$R^{124}$ contains an acid group having a neutralization point in a pH range of 7.0 to 12.0. Specific examples include a case where $R^{123}$ and $R^{124}$ contain an acid group, and a case where at least one of —$R^{122}$—O—$R^{123}$ or —$R^{122}$—O—$R^{124}$ contains —COOH, and at least one of —$R^{122}$—O—$R^{123}$ or —$R^{122}$—O—$R^{124}$ preferably includes —COOH.

In the present invention, it is preferable that at least one of the repeating units represented by Formula (2) is a repeating unit in which at least one of $R^{123}$ or $R^{124}$ contains a radically polymerizable group. The radically polymerizable group is a group capable of undergoing a crosslinking reaction by an action of a radical, and preferable examples thereof include a group having an ethylenically unsaturated bond.

Preferable examples of the polyimide precursor used in the present invention include: an embodiment in which both a repeating unit (2A) in which at least one (preferably both) of —$R^{122}$—O—$R^{123}$ or —$R^{122}$—O—$R^{124}$ contains an acid group having a neutralization point in a pH range of 7.0 to 12.0 and a repeating unit (2B) in which at least one (preferably both) of $R^{123}$ or $R^{124}$ contains a radically polymerizable group are contained; an embodiment in which a repeating unit (2C) in which one of —$R^{122}$—O—$R^{123}$ or —$R^{122}$—O—$R^{124}$ contains an acid group having a neutralization point in a pH range of 7.0 to 12.0, and one of $R^{123}$ or $R^{124}$ (one not containing an acid group) contains a radically polymerizable group is contained; and an embodiment in which at least one of the repeating unit (2A) or the repeating unit (2B) and the repeating unit (2C) are contained.

In the present invention, a molar ratio of the repeating unit (2A) to the repeating unit (2B) is preferably 99:1 to 80:20, and more preferably 98:2 to 90:10.

In the present invention, the total amount of the repeating unit (2A), the repeating unit (2B) and the repeating unit (2C) is preferably 80 mol % or more, more preferably 90 mol % or more, and still more preferably 95 mol % or more of all the repeating units of the polybenzoxazole precursor.

In addition, in the present invention, a ratio of the number of radically polymerizable groups contained in the polybenzoxazole precursor to the number of acid groups in a pH range of 7.0 to 12.0 is preferably 80:20 to 99:1, and more preferably 90:10 to 98:2.

The polybenzoxazole precursor may contain other types of repeating structural unit in addition to the repeating unit of the above Formula (2).

From the viewpoint that occurrence of warping of a cured film due to ring closure can be suppressed, the polybenzoxazole precursor preferably contains a diamine residue represented by Formula (SL) as the other type of repeating structural unit.

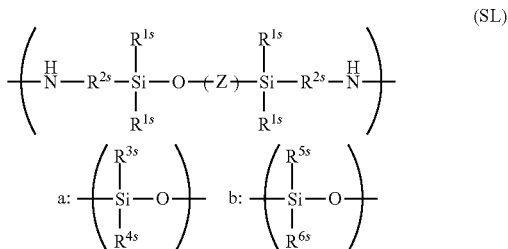

In Formula (SL), Z has an a structure and a b structure, $R^{1s}$ is a hydrogen atom or a hydrocarbon group having 1 to 10 carbon atoms, $R^{2s}$ is a hydrocarbon group having 1 to 10 carbon atoms, and at least one of $R^{3s}$, $R^{4s}$, $R^{5s}$, or $R^{6s}$ is an aromatic group and the rest, which may be the same as or different from each other, is a hydrogen atom or an organic group having 1 to 30 carbon atoms. Polymerization of the a structure and the b structure may be either block polymerization or random polymerization. In the Z portion, the a structure is 5% to 95 mol %, the b structure is 95% to 5 mol %, and a +b is 100 mol %.

In Formula (SL), as a preferable Z, the b structure in which $R^{5s}$ and $R^{6s}$ are phenyl groups is mentioned. In addition, a molecular weight of a structure represented by Formula (SL) is preferably 400 to 4,000, and more preferably 500 to 3,000. The molecular weight can be obtained by gel permeation chromatography which is commonly used. In a case where the molecular weight is set to be within the above-mentioned range, it is possible to decrease a modulus of elasticity of the polybenzoxazole precursor after dehydration ring closure, and to achieve both effects of suppressing warping and of improving solubility of the cured film.

In a case where a diamine residue represented by Formula (SL) is contained as the other type of repeating structural unit, from the viewpoint of improving alkaline solubility, it is preferable to further contain a tetracarboxylic acid residue that remains after removing an acid dianhydride group from tetracarboxylic acid dianhydride, as a repeating structural unit. As examples of such a tetracarboxylic acid residue, examples of $R^{115}$ in Formula (1) are mentioned.

A weight-average molecular weight (Mw) of the polybenzoxazole precursor is preferably 2,000 to 500,000, more preferably 5,000 to 100,000, and still more preferably 10,000 to 50,000. In addition, a number-average molecular weight (Mn) thereof is preferably 800 to 250,000, more preferably 2,000 to 50,000, and still more preferably 4,000 to 25,000.

The degree of dispersion of the polybenzoxazole precursor is preferably 1.5 to 2.5.

The content of the polymer precursor in the photosensitive resin composition according to the embodiment of the present invention is preferably 20% to 100% by mass with respect to the total solid content of the composition, more preferably 30% to 99% by mass, still more preferably 40% to 98% by mass, even more preferably 50% to 95% by mass, even still more preferably 60% to 95% by mass, and even still further more preferably, 70% to 95% by mass.

For the polymer precursor, only one type may be contained, or two or more types may be contained. In a case where two or more types are contained, a total amount thereof is preferably within the above-mentioned range.

<<Photo-Radical Polymerization Initiator>>

The composition according to the embodiment of the present invention contains a photo-radical polymerization initiator.

The photo-radical polymerization initiator that can be used in the present invention is not particularly limited, and can be appropriately selected from known photo-radical polymerization initiators. For example, a photo-radical polymerization initiator having photosensitivity to rays ranging from an ultraviolet ray range to a visible region is preferable.

In addition, the photo-radical polymerization initiator may be an activator which produces an active radical by some action with a photo-excited sensitizer.

The photo-radical polymerization initiator preferably contains at least one compound having a molar light absorption coefficient of at least about 50 within a range of about 300 to 800 nm (preferably 330 to 500 nm). The molar light absorption coefficient of the compound can be measured using a known method. For example, it is preferable to perform measurement at a concentration of 0.01 g/L using an ethyl acetate solvent with an ultraviolet-visible spectrophotometer (Cary-5 spectrophotometer manufactured by Varian).

Due to the fact that composition according to the embodiment of the present invention contains the photo-radical polymerization initiator, in a case where the composition according to the embodiment of the present invention is applied to a substrate such as a semiconductor wafer to form a photosensitive resin composition layer, and then is irradiated with light to cause curing to occur due to radicals, it is possible to reduce solubility in a light-irradiated portion. Therefore, there is an advantage that for example, by exposing the photosensitive resin composition layer through a photo mask having a pattern for masking only an electrode portion, a region having different solubility can be conveniently manufactured according to the pattern of the electrode.

As the photo-radical polymerization initiator, a known compound can be optionally used. For example, a halogenated hydrocarbon derivative (for example, a compound having a triazine skeleton, a compound having an oxadiazole skeleton, a compound having a trihalomethyl group), an acylphosphine compound such as an acylphosphine oxide, hexaarylbiimidazole, an oxime compound such as an oxime derivative, an organic peroxide, a thio compound, a ketone compound, an aromatic onium salt, ketoxime ether, an aminoacetophenone compound, hydroxyacetophenone, an azo-based compound, an azide compound, a metallocene compound, an organic boron compound, and an iron arene complex are mentioned. With regard to details thereof, reference can be made to the description of paragraphs 0165 to 0182 of JP2016-027357A, the content of which is incorporated herein.

As the ketone compound, for example, the compounds described in paragraph 0087 of JP2015-087611A are exemplified, the content of which is incorporated herein. For commercially available products, KAYACURE DETX (manufactured by Nippon Kayaku Co., Ltd.) is also suitably used.

As the photo-radical polymerization initiator, a hydroxyacetophenone compound, an aminoacetophenone compound, and an acylphosphine compound can also be suitably used. More specifically, for example, the aminoacetophenone-based initiators described in JP1998-291969A (JP-H10-291969A) and the acylphosphine oxide-based initiators described in JP4225898B can also be used.

As the hydroxyacetophenone-based initiator, IRGACURE 184 (IRGACURE is a registered trademark), DAROCUR (DAROCUR is a registered trademark) 1173, IRGACURE 500, IRGACURE-2959, and IRGACURE 127 (trade names: all manufactured by BASF) can be used.

As the aminoacetophenone-based initiator, IRGACURE 907, IRGACURE 369, and IRGACURE 379 (trade names: all manufactured by BASF) which are commercially available products can be used.

As the aminoacetophenone-based initiator, the compounds described in JP2009-191179A, of which an absorption maximum wavelength is matched to a light source having a wavelength such as 365 nm or 405 nm, can also be used.

As the acylphosphine-based initiator, 2,4,6-trimethylbenzoyl-diphenyl-phosphine oxide and the like are mentioned. In addition, IRGACURE-819 or IRGACURE-TPO (trade names: all manufactured by BASF) which are commercially available products can be used.

As the metallocene compound, IRGACURE-784 (manufactured by BASF) and the like are exemplified.

As the photo-radical polymerization initiator, an oxime compound is more preferably mentioned. By using the oxime compound, exposure latitude can be more effectively improved. The oxime compound is particularly preferable because the oxime compound has wide exposure latitude (exposure margin) and also works as a photo-base generator.

As specific examples of the oxime compound, the compounds described in JP2001-233842A, the compounds described in JP2000-080068A, and the compounds described in JP2006-342166A can be used.

As examples of preferable oxime compounds, compounds having the following structures, 3-benzooxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, 2-ethoxycarbonyloxyimino-1-phenylpropan-1-one, and the like are mentioned.

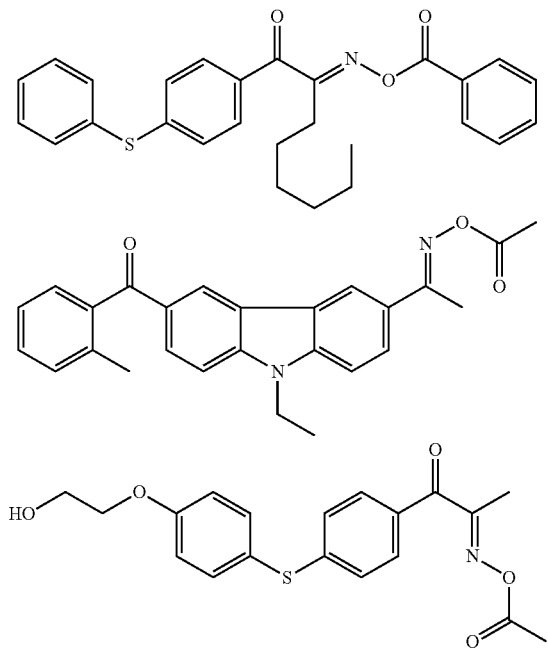

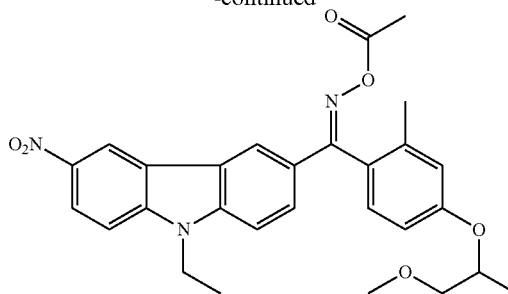

As commercially available products, IRGACURE OXE 01, IRGACURE OXE 02, IRGACURE OXE 03, IRGACURE OXE 04 (all manufactured by BASF), ADEKA OPTOMER N-1919 (manufactured by ADEKA Corporation, photo-radical polymerization initiator 2 described in JP2012-014052A) are also suitably used. In addition, TR-PBG-304 (manufactured by Changzhou Tronly New Electronic Materials Co., Ltd.), ADEKA ARKLS NCI-831, and ADEKA ARKLS NCI-930 (manufactured by ADEKA Corporation) can also be used. In addition, DFI-091 (manufactured by Daito Chemix Co., Ltd.) can be used.

Furthermore, it is also possible to use an oxime compound having a fluorine atom.

As specific examples of such oxime compounds, compounds described in JP2010-262028A, compounds 24, 36 to 40 described in paragraph 0345 of JP2014-500852A, a compound (C-3) described in paragraph 0101 of JP2013-164471A, and the like are mentioned.

As the most preferable oxime compound, oxime compounds having a specific substituent described in JP2007-269779A or oxime compounds having a thioaryl group shown in JP2009-191061A, and the like are mentioned.

From the viewpoint of exposure sensitivity, the photo-radical polymerization initiator is preferably a compound selected from the group consisting of a trihalomethyltriazine compound, a benzyl dimethyl ketal compound, an a-hydroxy ketone compound, an a-aminoketone compound, an acylphosphine compound, a phosphine oxide compound, a metallocene compound, an oxime compound, a triaryl imidazole dimer, an onium salt compound, a benzothiazole compound, a benzophenone compound, an acetophenone compound and a derivative thereof, a cyclopentadiene-benzene-iron complex and a salt thereof, a halomethyl oxadiazole compound, and a 3-aryl substituted coumarin compound.

More preferable photo-radical polymerization initiators are a trihalomethyltriazine compound, an a-aminoketone compound, an acylphosphine compound, a phosphine oxide compound, a metallocene compound, an oxime compound, a triarylimidazole dimer, an onium salt compound, a benzophenone compound, and an acetophenone compound, with at least one type of compound being selected from the group consisting of a trihalomethyltriazine compound, an a-aminoketone compound, an oxime compound, a triarylimidazole dimer, and a benzophenone compound being still more preferable, use of a metallocene compound or an oxime compound being still more preferable, and an oxime compound being still further more preferable.

In addition, as the photo-radical polymerization initiator, it is possible to use benzophenone, N,N'-tetraalkyl-4,4'-diaminobenzophenone such as N,N'-tetramethyl-4,4'-diaminobenzophenone (Michler's ketone), an aromatic ketone such as 2-benzyl-2-dimethylamino-1-(4-morpholinophenyl)-butanone-1, 2-methyl-1-[4-(methylthio)phenyl]-2-morpholino-propanone-1, quinones condensed with an aromatic ring such as alkylanthraquinone, a benzoin ether compound such as benzoin alkyl ether, a benzoin compound such as benzoin and alkylbenzoin, a benzyl derivative such as benzyl dimethyl ketal, and the like. In addition, a compound represented by Formula (I) may also be used.

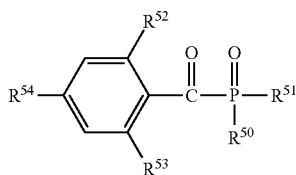

Formula (I)

In Formula (I), $R^{50}$ represents an alkyl group having 1 to 20 carbon atoms, an alkyl group having 2 to 20 carbon atoms which is interrupted by one or more oxygen atoms, an alkoxy group having 1 to 12 carbon atoms, a phenyl group, a phenyl group which is substituted with at least one of an alkyl group having 1 to 20 carbon atoms, an alkoxy group having 1 to 12 carbon atoms, a halogen atom, a cyclopentyl group, a cyclohexyl group, an alkenyl group having 2 to 12 carbon atoms, an alkyl group having 2 to 18 carbon atoms which is interrupted by one or more oxygen atoms, or an alkyl group having 1 to 4 carbon atoms, or biphenylyl group, $R^{51}$ is a group represented by Formula (II), or a group identical to $R^{50}$, and $R^{52}$ to $R^{54}$ each independently represent alkyl having 1 to 12 carbon atoms, alkoxy having 1 to 12 carbon atoms, or halogen.

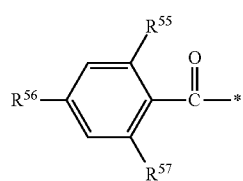

Formula (II)

In the formula, $R^{55}$ to $R^{57}$ are the same as $R^{52}$ to $R^{54}$ in Formula (I).

In addition, as the photo-radical polymerization initiator, the compounds described in paragraphs 0048 to 0055 of WO2015/125469A can also be used.

The content of the photo-radical polymerization initiator is preferably 0.1% to 30% by mass, more preferably 0.1% to 20% by mass, still more preferably 1% to 15% by mass, and even more preferably 1% to 10% by mass, with respect to the total solid content of the composition according to the embodiment of the present invention. For the photo-radical polymerization initiator, only one type may be contained, or two or more types may be contained. In a case where two or more types of photo-radical polymerization initiators are contained, a total thereof is preferably within the above-mentioned range.

<<Thermal-Radical Polymerization Initiator>>

The composition according to the embodiment of the present invention may contain a thermal-radical polymerization initiator within the scope of the present invention.

The thermal-radical polymerization initiator is a compound which generates radicals by heat energy and initiates or promotes a polymerization reaction of a compound having polymerization properties. By adding the thermal-radical polymerization initiator, a polymerization reaction of the polymer precursor can proceed together with cyclization of the polymer precursor. Thus, a higher degree of heat resistance can be achieved.

Specifically, as the thermal-radical polymerization initiator, compounds described in paragraphs 0074 to 0118 of JP2008-063554A are mentioned.

In a case where the thermal-radical polymerization initiator is contained, the content thereof is preferably 0.1% to 30% by mass, with respect to the total solid content of the composition according to the embodiment of the present invention, more preferably 0.1% to 20% by mass, and still more preferably 5% to 15% by mass. For the thermal-radical polymerization initiator, only one type may be contained, or two or more types may be contained. In a case where two or more types of thermal-radical polymerization initiators are contained, a total thereof is preferably within the above-mentioned range.

<<Solvent>>

The composition according to the embodiment of the present invention contains a solvent. As the solvent, a known solvent can be optionally used. The solvent is preferably an organic solvent. As the organic solvent, compounds such as esters, ethers, ketones, aromatic hydrocarbons, sulfoxides, and amides are mentioned.

As the esters, for example, ethyl acetate, n-butyl acetate, isobutyl acetate, amyl formate, isoamyl acetate, butyl propionate, isopropyl butyrate, ethyl butyrate, butyl butyrate, methyl lactate, ethyl lactate, γ-butyrolactone, ε-caprolactone, δ-valerolactone, alkyl alkyloxyacetate (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), 3-alkyloxypropionic acid alkyl esters (for example, methyl 3-alkyloxypropionate, and ethyl 3-alkyloxypropionate (for example, methyl 3-methoxypropionate, ethyl 3-methoxypropionate, methyl 3-ethoxypropionate, and ethyl 3-ethoxypropionate)), 2-alkyloxypropionic acid alkyl esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methylpropionate and ethyl 2-alkyloxy-2-methylpropionate (for example, methyl 2-methoxy-2-methylpropionate and ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate are suitably mentioned.

As the ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate are suitably mentioned.

As the ketones, for example, methyl ethyl ketone, cyclohexanone, cyclopentanone, 2-heptanone, and 3-heptanone are suitably mentioned.

As the aromatic hydrocarbons, for example, toluene, xylene, anisole, and limonene are suitably mentioned.

As the sulfoxides, for example, dimethyl sulfoxide is suitably mentioned.

As the amides, N-methyl-2-pyrrolidone, N-ethyl-2-pyrrolidone, N,N-dimethylacetamide, N,N-dimethylformamide, and the like are suitably mentioned.

From the viewpoint of improving properties of a coated surface or the like, it is also preferable to mix two or more types of solvents. The solvent is preferably a mixed solution including two or more selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclopentanone, γ-butyrolactone, dimethyl sulfoxide, ethyl carbitol acetate, butyl carbitol acetate, propylene glycol methyl ether, and propylene glycol methyl ether acetate. A combination of dimethyl sulfoxide and γ-butyrolactone is particularly preferable.

From the viewpoint of coating property, the content of the solvent is such that the total solid content concentration of the composition according to the embodiment of the present invention is preferably 5% to 80% by mass, more preferably 5% to 70% by mass, and particularly preferably 10% to 60% by mass. The content of the solvent may be adjusted depending on a desired thickness and a coating method.

For the solvent, one type may be contained, or two or more types may be contained.

In a case where two or more types of solvents are contained, a total thereof is preferably within the above-mentioned range.

<<Radically Polymerizable Compound>>

The composition according to the embodiment of the present invention preferably contains a radically polymerizable compound other than a polymer precursor (hereinafter, also referred to as a "polymerizable monomer"). By adopting such a constitution, a cured film which is excellent in heat resistance can be formed.

As the polymerizable monomer, a compound having a radically polymerizable group can be used. As the radically polymerizable group, a group having an ethylenically unsaturated bond such as a styryl group, a vinyl group, a (meth)acryloyl group, and an allyl group is mentioned. The radically polymerizable group is preferably a (meth)acryloyl group.

The polymerizable monomer may have one radically polymerizable group or two or more radically polymerizable groups. The polymerizable monomer preferably has two or more radically polymerizable groups, and more preferably three or more radically polymerizable groups. An upper limit thereof is preferably 15 or lower, more preferably 10 or lower, and still more preferably 8 or lower.

A molecular weight of the polymerizable monomer is preferably 2,000 or lower, more preferably 1,500 or lower, and still more preferably 900 or lower. A lower limit of the molecular weight of the polymerizable monomer is preferably 100 or higher.

From the viewpoint of developability, the composition according to the embodiment of the present invention preferably contains at least one bi- or higher-functional polymerizable monomer containing two or more polymerizable groups, and more preferably contains at least one tri- or higher-functional polymerizable monomer. In addition, the polymerizable monomer may be a mixture of a bifunctional polymerizable monomer and a tri- or higher-functional polymerizable monomer. The number of functional groups in the polymerizable monomer means the number of radically polymerizable groups in one molecule.

Specific examples of the polymerizable monomer include unsaturated carboxylic acids (for example, acrylic acid, methacrylic acid, itaconic acid, crotonic acid, isocrotonic acid, maleic acid), and esters and amides thereof, and are preferably esters of unsaturated carboxylic acids with polyhydric alcohol compounds, and amides of unsaturated carboxylic acids with polyvalent amine compounds. In addition, addition reaction products of unsaturated carboxylic acid esters or amides having a nucleophilic substituent such as a hydroxyl group, an amino group, and a mercapto group, with monofunctional or polyfunctional isocyanates or epoxies, dehydration condensation reaction products thereof with monofunctional or polyfunctional carboxylic acids, and the like are also suitably used. In addition, addition reaction products of unsaturated carboxylic acid esters or amides having an electrophilic substituent such as an isocyanate group and an epoxy group, with monofunctional or polyfunctional alcohols, amines, or thiols, and substitution reaction products of unsaturated carboxylic acid esters or amides having a leaving substituent such as a halogen group and a tosyloxy group with monofunctional or polyfunctional alcohols, amines, or thiols are also suitable. In addition, as another example, it is also possible to use a group of compounds in which the unsaturated carboxylic acid is substituted with an unsaturated phosphonic acid, a vinylbenzene derivative such as styrene, vinyl ether, allyl ether, or the like. As specific examples, reference can be made to the description of paragraphs 0113 to 0122 of JP2016-027357A, the content of which is incorporated herein.

In addition, the polymerizable monomer is also preferably a compound having a boiling point of 100° C. or higher under atmospheric pressure. As examples thereof, compounds obtained by adding ethylene oxide or propylene oxide to a polyfunctional alcohol such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl)isocyanurate, glycerin, and trimethylolethane, and then being subjected to (meth)acrylation, the urethane (meth)acrylates as described in JP1973-041708B (JP-S48-041708B), JP1975-006034B (JP-S50-006034B), and JP1976-037193A (JP-S51-037193A), polyester acrylates described in JP1973-064183A (JP-S48-064183A), JP1974-043191B (JP-S49-043191B), and JP1977-030490B (JP-S52-030490B), polyfunctional acrylates or methacrylates such as epoxy acrylates which are reaction products of epoxy resins and (meth)acrylic acid, and mixtures thereof can be mentioned. In addition, the compounds described in paragraphs 0254 to 0257 of JP2008-292970A are also suitable. Moreover, the polyfunctional (meth)acrylate or the like obtained by reacting a compound having a cyclic ether group and an ethylenically unsaturated group, such as glycidyl (meth)acrylate, with polyfunctional carboxylic acid can also be mentioned.

In addition, as other preferable polymerizable monomers, compounds having two or more groups containing a fluorene ring and an ethylenically unsaturated bond and cardo resins which are described in JP2010-160418A, JP2010-129825A, and JP4364216B can also be used.

Furthermore, as other examples, the specific unsaturated compounds described in JP1971-043946B (JP-S46-043946B), JP1989-040337B (JP-H1-040337B), and JP1989-040336B (JP-H1-040336B), the vinylphosphonic acid-based compounds described in JP1990-025493A (JP-H2-025493A), and the like can also be mentioned. In addition, the compounds containing a perfluoroalkyl group described in JP1986-022048A (JP-S61-022048A) can also be used. Furthermore, photo-polymerizable monomers and oligomers which are described in Journal of Japan Adhesive Association Vol. 20, No. 7, pages 300 to 308 (1984) can also be used.

In addition to the above, the compounds described in paragraphs 0048 to 0051 of JP2015-034964A can also be preferably used, the content of which is incorporated herein.

In addition, the compounds which are described in JP1998-062986A (JP-H10-062986A) as Formulae (1) and (2) as well as specific examples thereof and are obtained by adding ethylene oxide or propylene oxide to a polyfunctional alcohol and then being subjected to (meth)acrylation can be used as the polymerizable monomer.

Furthermore, the compounds described in paragraphs 0104 to 0131 of JP2015-187211A can also be used as the polymerizable monomer, the content of which is incorporated herein.

As the polymerizable monomer, dipentaerythritol triacrylate (as a commercially available product, KAYARAD D-330; manufactured by Nippon Kayaku Co., Ltd.), dipentaerythritol tetraacrylate (as a commercially available product, KAYARAD D-320; Nippon Kayaku Co., Ltd., A-TMMT: manufactured by Shin-Nakamura Chemical Co., Ltd.), dipentaerythritol penta(meth)acrylate (as a commercially available product, KAYARAD D-310; manufactured by Nippon Kayaku Co., Ltd.), dipentaerythritol hexa(meth)acrylate (as commercially available product, KAYARAD DPHA; by Nippon Kayaku Co., Ltd., A-DPH; manufactured by Shin-Nakamura Chemical Co., Ltd.), and structures in which (meth)acryloyl groups thereof are bonded via ethylene glycol or propylene glycol residues are preferable. Oligomer types thereof can also be used.

As commercially available products of the polymerizable monomer, for example, SR-494 which is a tetrafunctional acrylate having four ethyleneoxy chains, manufactured by Sartomer, SR-209 which is a bifunctional methacrylate having four ethyleneoxy chains, manufactured by Sartomer, DPCA-60 which is a hexafunctional acrylate having six pentyleneoxy chains, manufactured by Nippon Kayaku Co., Ltd., TPA-330 which is a trifunctional acrylate having three isobutylene oxy chains, NK Ester M-40G, NK Ester 4G, NK Ester M-9300, NK Ester A-9300, UA-7200 (manufactured by Shin-Nakamura Chemical Co., Ltd.), DPHA-40H (manufactured by Nippon Kayaku Co., Ltd.), UA-306H, UA-306T, UA-306I, AH-600, T-600, AI-600 (manufactured by Kyoeisha Chemical Co., Ltd.), Brenmer PME400 (manufactured by NOF Corporation), and the like are mentioned.

As the polymerizable monomer, the urethane acrylates as described in JP1973-041708B (JP-S48-041708B), JP1976-037193A (JP-S51-037193A), JP1990-032293B (JP-H2-032293B), and JP1990-016765B (JP-H2-016765B), and the urethane compounds having an ethylene oxide-based skeleton described in JP1983-049860B (JP-S58-049860B), JP1981-017654B (JP-S56-017654B), JP1987-039417B (JP-S62-039417B), and JP1987-039418B (JP-S62-039418B) are also suitable. Furthermore, as the polymerizable monomer, the compounds having an amino structure or a sulfide structure in a molecule as described in JP1988-277653A (JP-S63-277653A), JP1988-260909A (JP-S63-260909A), and JP1989-105238A (JP-H1-105238A) can also be used.

The polymerizable monomer may be a polymerizable monomer having an acid group such as a carboxyl group, a sulfo group, and a phosphoric acid group. The polymerizable monomer having an acid group is preferably ester of an aliphatic polyhydroxy compound and an unsaturated carboxylic acid, and more preferably a polymerizable monomer obtained by reacting an unreacted hydroxyl group of an aliphatic polyhydroxy compound with a non-aromatic carboxylic acid anhydride so as to have an acid group. Particularly preferably, the polymerizable monomer is a compound in which an aliphatic polyhydroxy compound is pentaerythritol and/or dipentaerythritol in a polymerizable monomer having an acid group obtained by reacting an unreacted hydroxyl group of the aliphatic polyhydroxy compound with a non-aromatic carboxylic acid anhydride. As commercially available products thereof, for example, M-510 and M-520 as polybasic acid-modified acrylic oligomers which are manufactured by Toagosei Co., Ltd. are mentioned.

For the polymerizable monomer having an acid group, one type may be used alone, or two or more types may be used in admixture. In addition, if necessary, a polymerizable monomer having no acid group and a polymerizable monomer having an acid group may be used in combination.

An acid value of the polymerizable monomer having an acid group is preferably 0.1 to 40 mgKOH/g, and particularly preferably 5 to 30 mgKOH/g. In a case where the acid value of the polymerizable monomer is within the above-mentioned range, excellent production and handling properties are exhibited, and furthermore, excellent developability is exhibited. In addition, good polymerization properties are exhibited.

From the viewpoint of good polymerization properties and heat resistance, the content of polymerizable monomer is preferably 1% to 50% by mass, with respect to the total solid content of the composition according to the embodiment of the present invention. A lower limit thereof is more preferably 5% by mass or higher. An upper limit thereof is more preferably 30% by mass or lower. For the polymerizable monomer, one type may be used alone, or two or more types may be used in admixture.

In addition, the mass ratio of the polymer precursor to the polymerizable monomer (polymer precursor/polymerizable monomer) is preferably 98/2 to 10/90, more preferably 95/5 to 30/70, and still more preferably 90/10 to 50/50. In a case where the mass ratio of the polymer precursor to the polymerizable monomer is within the above-mentioned range, a cured film which is excellent in polymerization properties and heat resistance can be formed.

In the composition according to the embodiment of the present invention, from the viewpoint of suppressing warping due to control of a modulus of elasticity of a cured film, a monofunctional polymerizable monomer can be preferably used. As the monofunctional polymerizable monomer, (meth)acrylic acid derivatives such as n-butyl (meth)acrylate, 2-ethylhexyl (meth)acrylate, 2-hydroxyethyl (meth)acrylate, butoxyethyl (meth)acrylate, carbitol (meth)acrylate, cyclohexyl (meth)acrylate, benzyl (meth)acrylate, phenoxyethyl (meth)acrylate, N-methylol (meth)acrylamide, glycidyl (meth)acrylate, polyethylene glycol mono (meth)acrylate, and polypropylene glycol mono(meth)acrylate, N-vinyl compounds such as N-vinylpyrrolidone and N-vinylcaprolactam, allyl compounds such as allyl glycidyl ether, diallyl phthalate, and triallyl trimellitate, and the like are preferably used. As the monofunctional polymerizable monomer, a compound having a boiling point of 100° C. or higher under atmospheric pressure is also preferable in order to suppress volatilization before exposure.

<<Other Polymerizable Compounds>>

The composition according to the embodiment of the present invention may further contain other polymerizable compounds, in addition to the polymer precursor and the radically polymerizable compound described above. As the other polymerizable compounds, a compound having a hydroxymethyl group, an alkoxymethyl group, or an acyloxymethyl group; an epoxy compound; an oxetane compound; and a benzoxazine compound are mentioned.

(Compound Having Hydroxymethyl Group, Alkoxymethyl Group, or Acyloxymethyl Group)

The compound having a hydroxymethyl group, an alkoxymethyl group, or an acyloxymethyl group is preferably a compound represented by Formula (AM1).

(AM1)

(In the formula, t represents an integer of 1 to 20, $R^4$ represents a t-valent organic group having 1 to 200 carbon atoms, $R^5$ represents a group represented by —$OR^6$ or —OCO—$R^7$, $R^6$ represents a hydrogen atom or an organic group having 1 to 10 carbon atoms, and $R^7$ represents an organic group having 1 to 10 carbon atoms.)

A content of the compound represented by Formula (AM1) is preferably 5 to 40 parts by mass with respect to 100 parts by mass of the polymer precursor. The content is more preferably 10 to 35 parts by mass. In addition, in the entire amount of the other polymerizable compounds, it is also preferable that a compound represented by Formula (AM4) is contained in an amount of 10% to 90% by mass and a compound represented by Formula (AM5) is contained in an amount of 10% to 90% by mass.

(AM4)

(In the formula, $R^4$ represents a divalent organic group having 1 to 200 carbon atoms, $R^5$ represents a group represented by —$OR^6$ or —OCO—$R^7$, $R^6$ represents a hydrogen atom or an organic group having 1 to 10 carbon atoms, and $R^7$ represents an organic group having 1 to 10 carbon atoms.)

(AM5)

(In the formula, u represents an integer of 3 to 8, $R^4$ represents a u-valent organic group having 1 to 200 carbon atoms, $R^5$ represents a group represented by —$OR^6$ or —OCO—$R^7$, $R^6$ represents a hydrogen atom or an organic group having 1 to 10 carbon atoms, and $R^7$ represents an organic group having 1 to 10 carbon atoms.)

By using the compound having a hydroxymethyl group or the like described above, it is possible to more effectively suppress occurrence of cracks in a case where the composition according to the embodiment of the present invention is applied onto a substrate having roughness. In addition, it is possible to form a cured film which is excellent in pattern processability and has high heat resistance such that a 5% mass reduction temperature is 350° C. or higher, and more preferably 380° C. or higher. As specific examples of the compound represented by Formula (AM4), 46DMOC, 46DMOEP (all trade names, manufactured by Asahi Organic Chemicals Industry Co., Ltd.), DML-MBPC, DML-MBOC, DML-OCHP, DML-PCHP, DML-PC, DML-PTBP, DML-34X, DML-EP, DML-POP, dimethylol BisOC-P, DML-PFP, DML-PSBP, DML-MTris PC (all trade names, manufactured by Honshu Chemical Industry Co., Ltd.), NIKALAC MX-290 (trade name, manufactured by Sanwa Chemical Co., Ltd.), 2,6-dimethoxymethyl-4-t-buthylphenol, 2,6-dimethoxymethyl-p-cresol, 2,6-diacethoxymethyl-p-cresol, and the like are mentioned.

In addition, as specific examples of the compound represented by Formula (AM5), TriML-P, TriML-35XL, TML-HQ, TML-BP, TML-pp-BPF, TML-BPA, TMOM-BP, HML-TPPHBA, HML-TPHAP, HMOM-TPPHBA, HMOM-TPHAP (all trade name, manufactured by Honshu Chemical Industry Co., Ltd.), TM-BIP-A (trade name, manufactured by Asahi Organic Materials Industry Co., Ltd.), NIKALAC MX-280, NIKALAC MX-270, and NIKALAC MW-100LM (all trade names, manufactured by Sanwa Chemical Co., Ltd.) are mentioned.

(Epoxy Compound (Compound Having Epoxy Group))

The epoxy compound is preferably a compound having two or more epoxy groups in one molecule. Since the epoxy group undergoes a crosslinking reaction at 200° C. or lower and a dehydration reaction derived from crosslinking does not occur, film shrinkage hardly occurs. Therefore, containing an epoxy compound is effective for low-temperature curing of the composition and suppression of warping of a cured film.

The epoxy compound preferably contains a polyethylene oxide group. As a result, it is possible to further decrease a modulus of elasticity and to suppress warping. The polyethylene oxide group means a group in which the number of repeating units of ethylene oxide is 2 or higher, with the number of repeating units being preferably 2 to 15.

As examples of the epoxy compound, bisphenol A type epoxy resin; bisphenol F type epoxy resin; alkylene glycol type epoxy resin such as propylene glycol diglycidyl ether; polyalkylene glycol type epoxy resin such as polypropylene glycol diglycidyl ether; epoxy group-containing silicone such as polymethyl(glycidyloxypropyl) siloxane, and the like can be mentioned, but not limited thereto. Specifically, EPICLON (registered trademark) 850-S, EPICLON (registered trademark) HP-4032, EPICLON (registered trademark) HP-7200, EPICLON (registered trademark) HP-820, EPICLON (registered trademark) HP-4700, EPICLON (registered trademark) EXA-4710, EPICLON (registered trademark) HP-4770, EPICLON (registered trademark) EXA-859CRP, EPICLON (registered trademark) EXA-1514, EPICLON (registered trademark) EXA-4880, EPICLON (registered trademark) EXA-4850-150, EPICLON (registered trademark) EXA-4850-1000, EPICLON (registered trademark) EXA-4816, EPICLON (registered trademark) EXA-4822 (all trade names, manufactured by Dainippon Ink and Chemicals, Inc.), RIKARESIN (registered trademark) BEO-60E (trade name, manufactured by New Japan Chemical Co., Ltd.), EP-4003S, EP-4000S (all trade names, manufactured by ADEKA CORPORATION), and the like are mentioned. Among these, an epoxy resin containing a polyethylene oxide group is preferable from the viewpoint of suppression of warping and excellent heat resistance. For example, EPICLON (registered trademark) EXA-4880, EPICLON (registered trademark) EXA-4822, and RIKARESIN (registered trademark) BEO-60E are preferable due to containing a polyethylene oxide group.

A content of the epoxy compound is preferably 5 to 50 parts by mass, more preferably 10 to 50 parts by mass, and still more preferably 10 to 40 parts by mass, with respect to 100 parts by mass of the polymer precursor. In a case where the content of the epoxy compound is 5 parts by mass or higher, warping of the obtained cured film can be further suppressed, and in a case where the content is 50 parts by mass or less, the pattern embedding resulting from the reflow at the time of curing can further be suppressed.

(Oxetane Compound (Compound Having an Oxetanyl Group))

As the oxetane compound, a compound having two or more oxetane rings in one molecule, 3-ethyl-3-hydroxymethyloxetane, 1,4-bis{[(3-ethyl-3-oxetanyl)methoxy]methyl}benzene, 3-ethyl-3-(2-ethylhexylmethyl)oxetane, 1,4-benzenedicarboxylic acid-bis[(3-ethyl-3-oxetanyl)methyl]ester, and the like can be mentioned. As specific examples thereof, ARON OXETANE series (for example, OXT-121, OXT-221, OXT-191, OXT-223) manufactured by Toagosei Co., Ltd. can be suitably used. These may be used alone or two or more types thereof may be used in admixture.

A content of the oxetane compound is preferably 5 to 50 parts by mass, more preferably 10 to 50 parts by mass, and still more preferably 10 to 40 parts by mass, with respect to 100 parts by mass of the polymer precursor.

(Benzoxazine Compound (Compound Having Benzoxazolyl Group))

Due to a crosslinking reaction derived from a ring-opening addition reaction, the benzoxazine compound does not result in degassing during curing, and results in decreased thermal contraction so that occurrence of warping is suppressed, which is preferable.

As preferred examples of the benzoxazine compound, B-a type benzoxazine, B-m type benzoxazine (all trade names, manufactured by Shikoku Chemicals Corporation), a benzoxazine adduct of polyhydroxystyrene resin, and a phenol novolak type dihydrobenzo oxazine compound are mentioned. These may be used alone or two or more types thereof may be used in admixture.

A content of the benzoxazine compound is preferably 5 to 50 parts by mass, more preferably 10 to 50 parts by mass, and still more preferably 10 to 40 parts by mass, with respect to 100 parts by mass of the polymer precursor.

<<Migration Suppressing Agent>>

The photosensitive resin composition preferably further contains a migration suppressing agent. By containing the migration suppressing agent, it is possible to effectively prevent metal ions derived from a metal layer (metal wiring) from being migrated into a photosensitive resin composition layer.

As the migration suppressing agent, there is no particular limitation, and compounds having a heterocyclic ring (a pyrrole ring, a furan ring, a thiophene ring, an imidazole ring, an oxazole ring, a thiazole ring, a pyrazole ring, an isoxazole ring, an isothiazole ring, a tetrazole ring, a pyridine ring, a pyridazine ring, a pyrimidine ring, a pyrazine ring, a piperidine ring, a piperazine ring, a morpholine ring, a 2H-pyran ring and a 6H-pyran ring, a triazine ring), compounds having thioureas and a mercapto group, hindered phenol-based compounds, salicylic acid derivative-based compounds, and hydrazide derivative-based compounds are mentioned. In particular, triazole-based compounds such as triazole and benzotriazole, and tetrazole-based compounds such as tetrazole and benzotetrazole can be preferably used.

In addition, an ion trapping agent that captures an anion such as a halogen ion can also be used.

As other migration suppressing agents, the rust inhibitors described in paragraph 0094 of JP2013-015701A, the compounds described in paragraphs 0073 to 0076 of JP2009-283711A, the compounds described in paragraph 0052 of JP2011-059656A, and the compounds described in paragraphs 0114, 0116, and 0118 of JP2012-194520A, and the like can be used.

The following compounds can be mentioned as specific examples of the migration suppressing agent.

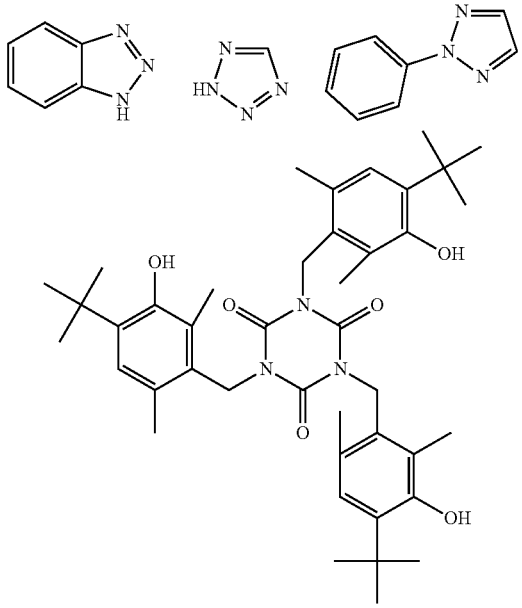

In a case where the photosensitive resin composition includes the migration suppressing agent, a content of the migration suppressing agent is preferably 0.01% to 5.0% by mass, more preferably 0.05% to 2.0% by mass, and still more preferably 0.1% to 1.0% by mass, with respect to a total solid content of the photosensitive resin composition.

For the migration suppressing agent, only one type may be used, or two or more types may be used. In a case where two or more types of migration suppressing agents are used, a total thereof is preferably within the above-mentioned range.

<<Polymerization Inhibitor>>

The composition according to the embodiment of the present invention preferably contains a polymerization inhibitor.

As the polymerization inhibitor, for example, hydroquinone, 1,4-methoxyphenol, di-tert-butyl-p-cresol, pyrogallol, p-tert-butylcatechol, 1,4-benzoquinone, diphenyl-p-benzoquinone, 4,4'-thiobis(3-methyl-6-tert-butylphenol), 2,2'-methylenebis(4-methyl-6-tert-butylphenol), N-nitroso-N-phenylhydroxyamine aluminum salt, phenothiazine, N-nitrosodiphenylamine, N-phenyl naphthylamine, ethylenediamine tetraacetic acid, 1,2-cyclohexanediamine tetraacetic acid, glycol ether diamine tetraacetic acid, 2,6-di-tert-butyl-4-methyl phenol, 5-nitroso-8-hydroxyquinoline, 1-nitroso-2-naphtoyl, 2-nitroso-1-naphtoyl, 2-nitroso-5-(N-ethyl-N-sulfopropylamino)phenol, N-nitroso-N-(1-naphthyl)hydroxyamine ammonium salt, and bis(4-hydroxy-3,5-tert-butyl)phenylmethane are suitably used. In addition, the polymerization inhibitors described in paragraph 0060 of JP2015-127817A and the compounds described in paragraphs 0031 to 0046 of WO2015/125469A can also be used.

In addition, the following compounds can be used (Me is a methyl group).

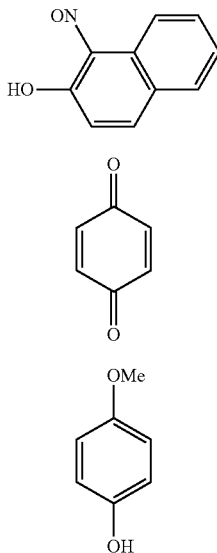

F-1

F-2

F-3

In a case where the composition according to the embodiment of the present invention has a polymerization inhibitor, the content of the polymerization inhibitor is preferably 0.01% to 5% by mass with respect to the total solid content of the composition according to the embodiment of the present invention.

For the polymerization inhibitor, only one type may be used, or two or more types may be used. In a case where two or more types of polymerization inhibitors are used, a total thereof is preferably within the above-mentioned range.

<<Metal Adhesiveness Improving Agent>>

The composition according to the embodiment of the present invention preferably contains a metal adhesiveness improving agent for improving adhesiveness to a metal material used for electrodes, wirings, and the like. As the metal adhesiveness improving agent, a silane coupling agent and the like are mentioned.

As examples of the silane coupling agent, the compounds described in paragraphs 0062 to 0073 of JP2014-191002A, the compounds described in paragraphs 0063 to 0071 of WO2011/080992A1, the compounds described in paragraphs 0060 and 0061 of JP2014-191252A, the compounds described in paragraphs 0045 to 0052 of JP2014-041264A, and the compounds described in paragraph 0055 of WO2014/097594A are mentioned. In addition, it is also preferable to use two or more types of the different silane coupling agents as described in paragraphs 0050 to 0058 of JP2011-128358A. In addition, as the silane coupling agent, the following compounds are also preferably used. In the following formulae, Et represents an ethyl group.

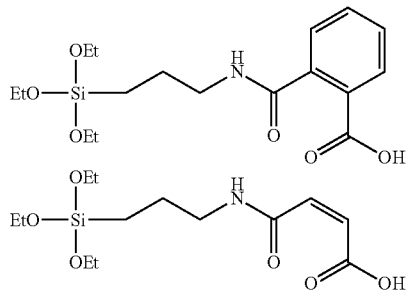

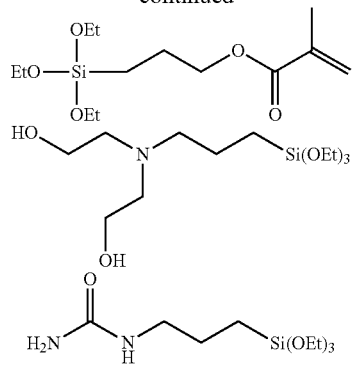

In addition, as the metal adhesiveness improving agent, the compounds described in paragraphs 0046 to 0049 of JP2014-186186A, and the sulfide-based compounds described in paragraphs 0032 to 0043 of JP2013-072935A can also be used.

The content of the metal adhesiveness improving agent is preferably 0.1 to 30 parts by mass, and more preferably 0.5 to 15 parts by mass with respect to 100 parts by mass of the polymer precursor. In a case where the content is 0.1 parts by mass or higher, good adhesiveness between a cured film and a metal layer after a curing step is exhibited, and in a case where the content is 30 parts by mass or lower, heat resistance of the cured film after the curing step and mechanical properties are exhibited. Regarding the metal adhesiveness improving agent, only one type may be used, or two or more types may be used. In a case where two or more types are used, a total thereof is preferably within the above-mentioned range.

<<Base Generator>>

The composition used in the present invention may contain a base generator. The base generator may be a thermal-base generator or a photo-base generator.

<<<Thermal-Base Generator>>>

As the thermal-base generator, a type and the like thereof are not particularly specified, and the thermal-base generator preferably includes a thermal-base generator that contains at least one type selected from an acidic compound which generates a base in case of being heated to 40° C. or higher, or an ammonium salt which has an ammonium cation and anion of which the pKa1 is 0 to 4. Herein, pKa1 is a logarithmic expression ($-\mathrm{Log}_{10}\mathrm{Ka}$) of the dissociation constant (Ka) of the first proton of the polyvalent acid.

By blending such a compound, the cyclization reaction of the polymer precursor can be carried out at a low temperature, and a composition with more excellent stability can be obtained. In addition, since the thermal-base generator does not generate a base in case of being not heated, the cyclization of the polymer precursor during storage can be suppressed even in a case where the thermal-base generator coexists with the polymer precursor, which leads to excellent storage stability.

The thermal-base generator of the present invention includes at least one type selected from an acidic compound (A1) which generates a base in a case of being heated to 40° C. or higher, or an ammonium salt (A2) which has an ammonium cation and anion of which the pKa1 is 0 to 4.

The acidic compound (A1) and the ammonium salt (A2) generate a base in case of being heated. Thus, the base generated from these compounds makes it possible to promote a cyclization reaction of the polymer precursor, and makes it possible to cause cyclization of the polymer precursor to be carried out at a low temperature. In addition, even in a case where these compounds are caused to coexist with a polymer precursor which is cyclized by a base and cured, cyclization of the polymer precursor hardly proceeds unless heated, so that a photosensitive resin composition having excellent stability can be prepared.

The acidic compound of the present specification means a compound having a pH value lower than 7, which is measured by a pH meter at 20° C., in a case where 1 g of the compound is taken in a container and 50 mL of mixed solution of deionized water and tetrahydrofuran (mass ratio is water/tetrahydrofuran=1/4) is added to the compound, and the solution is stirred for an hour at room temperature.

In the present invention, a base generation temperature of the acidic compound (A1) and the ammonium salt (A2) is preferably 40° C. or higher, and more preferably 120° C. to 200° C. An upper limit of the base generation temperature is preferably 190° C. or lower, more preferably 180° C. or lower, and still more preferably 165° C. or lower. A lower limit of the base generation temperature is preferably 130° C. or higher, and more preferably 135° C. or higher.

In a case where the base generation temperature of the acidic compound (A1) and ammonium salt (A2) is 120° C. or higher, since the base is hardly generated during storage, a photosensitive resin composition having excellent stability can be prepared. In a case where the base generation temperature of the acidic compound (A1) and the ammonium salt (A2) is 200° C. or lower, a cyclization temperature of the polymer precursor can be decreased. For example, the base generation temperature may be measured, for example, using differential scanning calorimetry by heating a compound to 250° C. at a rate of 5° C./min in a pressure-resistant capsule, reading a peak temperature of an exothermic peak having the lowest temperature, and taking the peak temperature as a base generation temperature.

In the present invention, a base generated by the thermal-base generator is preferably a secondary amine or a tertiary amine, and more preferably a tertiary amine. Since the tertiary amine is highly basic, the cyclization temperature of the polymer precursor can be further reduced. In addition, a boiling point of the base generated by the thermal-base generator is preferably 80° C. or higher, more preferably 100° C. or higher, and still more preferably 140° C. or higher. In addition, a molecular weight of the generated base is preferably 80 to 2,000. A lower limit thereof is more preferably 100 or higher. An upper limit thereof is more preferably 500 or lower. A value of the molecular weight is a theoretical value obtained from a structural formula.

In the present invention, the acidic compound (A1) preferably contains one or more types selected from an ammonium salt and a compound represented by Formula (101) or (102) described later.

In the present invention, the ammonium salt (A2) is preferably an acidic compound. The ammonium salt (A2) may be a compound containing an acidic compound which generates a base in a case of being heated to 40° C. or higher (preferably 120° C. to 200° C.), or may be a compound other than the acidic compound which generates a base in a case of being heated to 40° C. or higher (preferably 120° C. to 200° C.).

<<<<Ammonium Salt>>>>

In the present invention, the ammonium salt means a salt of an ammonium cation represented by Formula (101) or Formula (102) with an anion. The anion may be bonded via a covalent bond to any portion of the ammonium cation, or may also be present outside a molecule of the ammonium cation, but it is preferable for the anion to be present outside the molecule of the ammonium cation. The expression of the anion being present outside the molecule of the ammonium cation refers to a case where the ammonium cation and the anion are not bonded via a covalent bond. Hereinafter, an anion outside a molecule of a cation moiety is also referred to as a counter anion.

Formula (101) and Formula (102)

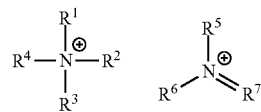

In the formulae, $R^1$ to $R^6$ each independently represent a hydrogen atom or a hydrocarbon group, and $R^7$ represents a hydrocarbon group. $R^1$ and $R^2$, $R^3$ and $R^4$, $R^5$ and $R^6$, and $R^5$ and $R^7$ may be bonded to each other to form a ring.

The ammonium cation is preferably represented by any one of Formulae (Y1-1) to (Y1-5).

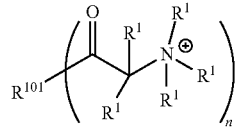 (Y1-1)

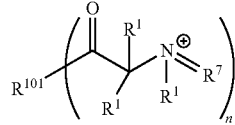 (Y1-2)

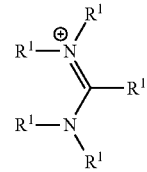 (Y1-3)

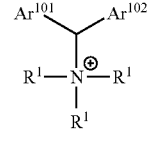 (Y1-4)

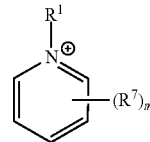 (Y1-5)

In Formulae (Y1-1) to (Y1-5), $R^{101}$ represents an n-valent organic group, and $R^1$ and $R^7$ have the same meanings as $R^1$ and $R^7$ in Formula (101) or Formula (102). n represents an integer of 1 or more, and m represents an integer of 0 to 5.

In Formula (Y1-4), $Ar^{101}$ and $Ar^{102}$ each independently represent an aryl group.

In the present embodiment, the ammonium salt preferably has an anion having pKa1 of 0 to 4 and an ammonium cation. An upper limit of the pKa1 of the anion is more preferably 3.5 or lower, and still more preferably 3.2 or lower. A lower limit thereof is preferably 0.5 or higher, and more preferably 1.0 or higher. In a case where the pKa1 of the anion is within the above-mentioned range, the polymer precursor can be cyclized at a lower temperature, and stability of the composition can also be improved. In a case where the pKa1 is 4 or lower, good stability of the thermal-base generator can be exhibited and generation of a base can be suppressed in the absence of heating, so that the composition exhibits good stability. In a case where the pKa1 is 0 or higher, the generated base is hardly neutralized, and cyclization efficiency of the polymer precursor or the like is good.

A type of the anion is preferably one selected from a carboxylate anion, a phenol anion, a phosphate anion, and a sulfate anion, and a carboxylate anion is more preferable for the reason that both salt stability and thermal decomposability are achieved. That is, the ammonium salt is more preferably a salt of an ammonium cation with a carboxylate anion.

The carboxylate anion is preferably an anion of a divalent or higher carboxylic acid having two or more carboxyl groups, and more preferably an anion of a divalent carboxylic acid. According to this embodiment, it is possible to use a thermal-base generator which can further improve stability, curability, and developability of the composition. In particular, by using an anion of a divalent carboxylic acid, stability, curability, and developability of the composition can be further improved.

In the present embodiment, the carboxylate anion is preferably an anion of a carboxylic acid having pKa1 of 4 or lower. The pKa1 is more preferably 3.5 or lower, and still more preferably 3.2 or lower. According to this embodiment, stability of the composition can be further improved.

Here, the pKa1 represents logarithm of a reciprocal of a dissociation constant of a first proton of an acid and reference can be made to the values described in Determination of Organic Structures by Physical Methods (written by Brown, H. C., McDaniel, D. H., Hafliger, O., Nachod, F C.; complied by Braude, E. A., Nachod, F C.; and Academic Press, New York, 1955), or Data for Biochemical Research (written by Dawson, R. M. C. et al.; and Oxford, Clarendon Press, 1959). For compounds which are not described in these documents, values calculated from structural formulae using a software ACD/pKa (manufactured by ACD/Labs) are used.

The carboxylate anion is preferably represented by Formula (X1).

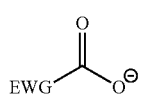

(X1)

In Formula (X1), EWG represents an electron withdrawing group.

In the present embodiment, the electron withdrawing group means a group in which a Hammett's substituent constant σm shows a positive value. Here, the σm is described in detail in the review by TSUNO Yuho, Journal of the Society of Synthetic Organic Chemistry, Japan, Vol. 23, No. 8 (1965), pp. 631 to 642. The electron withdrawing group in the present embodiment is not limited to the substituents described in the document.

As examples of a substituent having a positive value of σm, for example, a $CF_3$ group (σm=0.43), a $CF_3CO$ group (σm=0.63), an HC≡C group (σm=0.21), a $CH_2$=CH group (σm=0.06), an Ac group (σm=0.38), a MeOCO group (σm=0.37), a MeCOCH=CH group (σm=0.21), a PhCO group (σm=0.34), and $H_2NCOCH_2$ group (σm=0.06) are mentioned. Me represents a methyl group, Ac represents an acetyl group, and Ph represents a phenyl group (hereinafter the same applies).

EWG is preferably a group represented by Formulae (EWG-1) to (EWG-6).

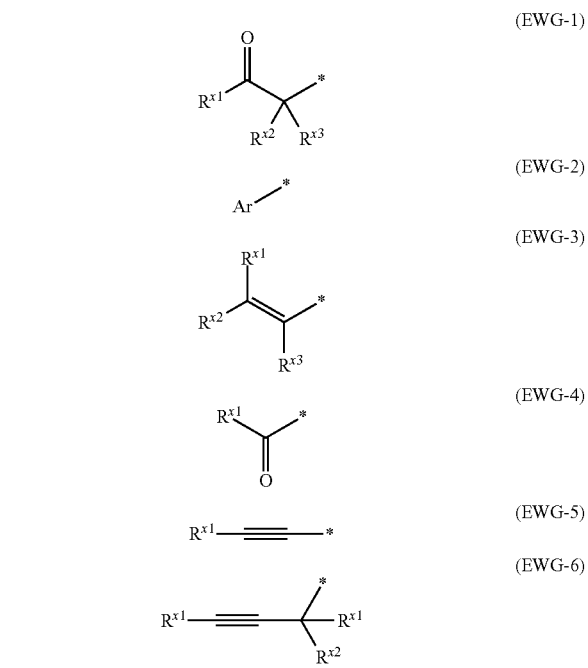

In Formulae (EWG-1) to (EWG-6), $R^{x1}$ to $R^{x3}$ each independently represent a hydrogen atom, an alkyl group, an alkenyl group, an aryl group, a hydroxyl group, or a carboxyl group, and Ar represents an aromatic group.

In the present embodiment, the carboxylate anion is preferably represented by Formula (XA).

Formula (XA)

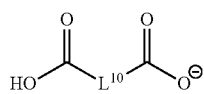

In Formula (XA), $L^{10}$ represents a single bond, or a divalent linking group selected from an alkylene group, an alkenylene group, an aromatic group, —$NR^x$—, and a combination thereof, and Rx represents a hydrogen atom, an alkyl group, an alkenyl group, or an aryl group.

As specific examples of the carboxylate anion, a maleate anion, a phthalate anion, an N-phenyliminodiacetate anion, and an oxalate anion are mentioned.

The details of the thermal-base generator can be referred to the description in paragraphs 0021 to 0077 of JP2016-027357A, the content of which is incorporated herein.

For the thermal-base generator, the following compounds are exemplified.

-continued
(A-1) 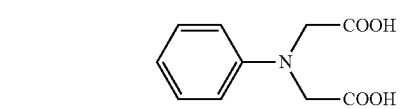
(A-2) 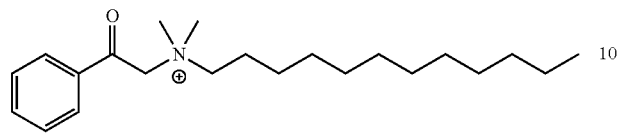
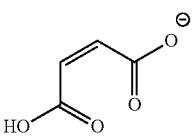
(A-3) 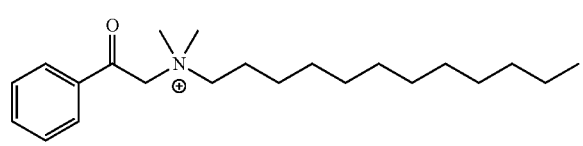
(A-4) 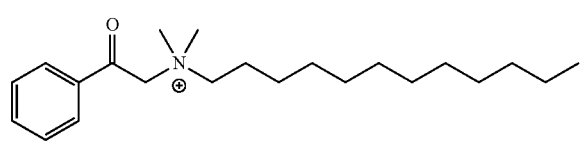
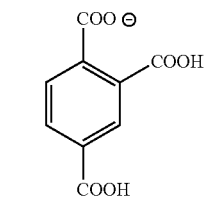
(A-5) 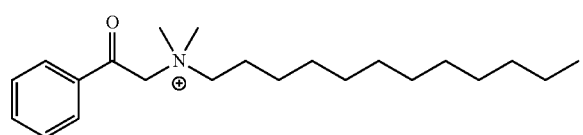
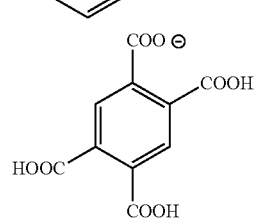
(A-6) 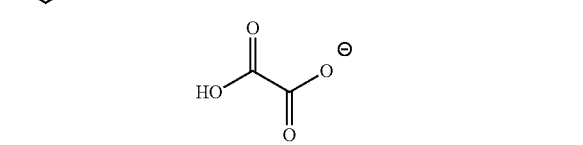
(A-7) 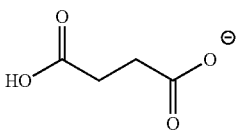
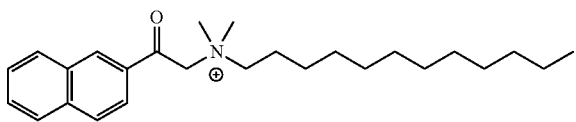
(A-8) 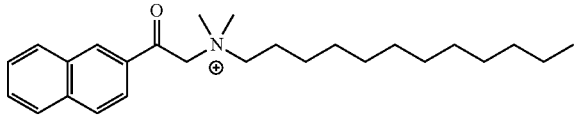
(A-9) 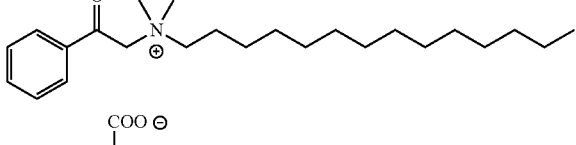
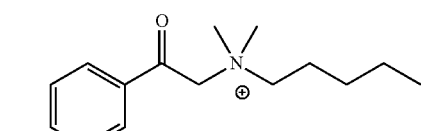
(A-10) 
(A-11) 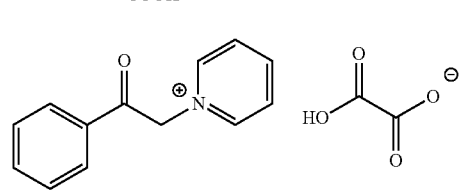

In a case where the thermal-base generator is used, the content of the thermal-base generator in the composition is preferably 0.1% to 50% by mass with respect to the total solid content of the composition. A lower limit thereof is more preferably, 0.5% by mass or higher, and still more preferably 1% by mass or higher. An upper limit thereof is more preferably 30% by mass or lower, and still more preferably 20% by mass or lower.

For the thermal-base generator, one type or two or more types may be used. In a case where two or more types are used, a total amount is preferably within the above-mentioned range.

<<<Photo-Base Generator>>>

The photosensitive resin composition used in the embodiment of the present invention may contain a photo-base generator. The photo-base generator generates a base by exposure.

The photo-base generator is not particularly limited as long as the photo-base generator does not show activity under normal conditions of normal temperature and pressure and generates the base (basic substance) in a case where irradiation with electromagnetic waves and heating are performed as external stimuli. Since the base generated by the exposure acts as a catalyst for curing the polymer precursor by heating, the base can be suitably used in negative type.

In the present invention, a known photo-base generator can be used. For example, as described in M. Shirai, and M. Tsunooka, Prog. Polym. Sci., 21, 1 (1996); Masahiro Tsukaoka, polymer processing, 46, 2 (1997); C. Kutal, Coord. Chem. Rev., 211, 353 (2001); Y. Kaneko, A. Sarker, and D. Neckers, Chem. Mater., 11, 170 (1999); H. Tachi, M. Shirai, and M. Tsunooka, J. Photopolym. Sci. Technol., 13, 153 (2000); M. Winkle, and K. Graziano, J. Photopolym. Sci. Technol., 3, 419 (1990); M. Tsunooka, H. Tachi, and S. Yoshitaka, J. Photopolym. Sci. Technol., 9, 13 (1996); K. Suyama, H. Araki, M. Shirai, J. Photopolym. Sci. Technol., 19, 81 (2006), a transition metal compound complex, a compound having a structure such as an ammonium salt, an ionic compound, such as a compound in which an amidine moiety is latent by forming a salt with carboxylic acid, of which the base component forms a salt so as to be neutralized, and a non-ionic compound in which base component is latent by a urethane bond such as acyl compound or oxime bond such as carbamate derivatives, oxime ester derivatives are exemplified.

The basic substance generated from the photo-base generator is not particularly limited, and compounds having an amino group, particularly monoamines, polyamines such as diamines, and amidines are exemplified.

The generated basic substance is preferably a compound having a more highly basic amino group. This is because the catalytic action on the dehydration condensation reaction and the like in the imidization of the polymer precursor is strong, and the addition of a smaller amount makes it possible to exhibit the catalytic effect in the dehydration condensation reaction and the like at a lower temperature. That is, since the catalytic effect of the generated basic substance is large, the apparent sensitivity as a negative type photosensitive resin composition is improved.

From the viewpoint of the above-described catalytic effect, amidine and aliphatic amine are preferred.

The photo-base generator used in the present invention is preferably a compound containing an aromatic ring and a compound in which the generated basic substance has an amino group.

As the photo-base generator according to the present invention, for example, a photo-base generator having a cinnamic acid amide structure as disclosed in JP2009-080452A and WO2009/123122A, a photo-base generator having a carbamate structure as disclosed in JP2006-189591A and JP2008-247747A, a photo-base generator having an oxime structure or a carbamoyl oxime structure disclosed in JP2007-249013A and JP2008-003581A, and like are mentioned, but not limited to thereto. In addition other photo-base generators having known structures can be used.

In addition, as the photo-base generator, compounds described in paragraphs 0185 to 0188, 0199, 0200 and 0202 of JP2012-093746A, compounds described in paragraphs 0022 to 0069 of JP2013-194205A, compounds described in paragraphs 0026 to 0074 of JP2013-204019A, and the compounds described in paragraph 0052 of WO2010/064631A are mentioned as examples.

As commercially available products of photo-base generators, WPBG-266, WPBG-300, WPGB-345, WPGB-140, WPBG-165, WPBG-027, PBG-018, WPGB-015, WPBG-041, WPGB-172, WPGB-174, WPGB-166, WPGB-158, WPGB-025, WPGB-168, WPGB-167 and WPBG-082 (manufactured by Wako Pure Chemical Industries, Co., Ltd.) can also be used.

Additionally, the following compounds are exemplified as a photo-base generator.

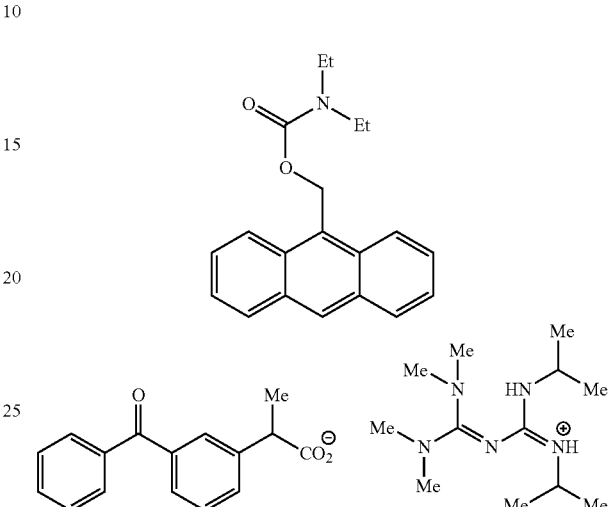

In a case where the photo-base generator is used, the content of the photo-base generator in the resin composition of the present invention is preferably 0.1% to 50% by mass with respect to the total solid content of the composition. A lower limit thereof is more preferably, 0.5% by mass or higher, and still more preferably 1% by mass or higher. An upper limit thereof is more preferably 30% by mass or lower, and still more preferably 20% by mass or lower.

For the photo-base generator, one type or two or more types may be used. In a case where two or more types are used, a total amount is preferably within the above-mentioned range.

<<Other Additives>>

Various additives, for example, a thermal-acid generator, a sensitizing dye, a chain transfer agent, a surfactant, a higher fatty acid derivative, an inorganic particle, a curing agent, a curing catalyst, a filler, an antioxidant, an ultraviolet absorbent, and an aggregation inhibitor can be blended, as necessary, with the composition according to the embodiment of the present invention to the extent that an effect of the present invention is not impaired. In a case where these additives are blended, a total blending amount thereof is preferably 3% by mass or lower of the solid content of the composition.

<<<Thermal-Acid Generator>>>

The composition according to the embodiment of the present invention may contain a thermal-acid generator. The thermal-acid generator generates an acid by heating, and promotes cyclization of the polymer precursor, so that mechanical properties of a cured film are further improved. For the thermal-acid generator, compounds described in paragraph 0059 of JP2013-167742A is mentioned.

A content of the thermal-acid generator is preferably 0.01 parts by mass or higher, and more preferably 0.1 parts by mass or higher, with respect to 100 parts by mass of the polymer precursor. In a case where the thermal-acid generator is contained in an amount of 0.01 parts by mass or higher, crosslinking reaction and cyclization of the polymer precursor are promoted, so that mechanical properties and chemical resistance of the cured film can be further improved. In addition, the content of the thermal-acid generator is preferably 20 parts by mass or lower, more preferably 15 parts by mass or lower, and particularly preferably 10 parts by mass or lower, from the viewpoint of electrical insulating properties of the cured film.

For the thermal-acid generator, only one type may be used, or two or more types may be used. In a case where two or more types are used, a total amount is preferably within the above-mentioned range.

<<<Sensitizing Dye>>>

The composition according to the embodiment of the present invention may contain a sensitizing dye. The sensitizing dye absorbs a specific actinic radiation and becomes an electronically excited state. The sensitizing dye in the electronically excited state is brought into contact with a thermal-base generator, a thermal-radical polymerization initiator, a photo-radical polymerization initiator, or the like, In a case where the composition according to the embodiment of the present invention has the chain transfer agent, the content of the chain transfer agent is preferably 0.01 to 20 parts by mass, more preferably 1 to 10 parts by mass, and even more preferably 1 to 5 parts by mass, with respect to 100 parts by mass of the total solid content of the composition according to the embodiment of the present invention. For the chain transfer agent, only one type may be used, or two or more types may be used. In a case where two or more types of chain transfer agents are used, a total thereof is preferably within the above-mentioned range.

<<<Surfactant>>>

From the viewpoint of further improving the coating property, each kind of surfactant may be added to the composition according to the embodiment of the present invention. As the surfactant, each kind of surfactants such as a fluorine-based surfactant, a non-ionic surfactant, a cationic surfactant, an anionic surfactant, and a silicone-based surfactant can be used. In addition, the following surfactants are preferably used.

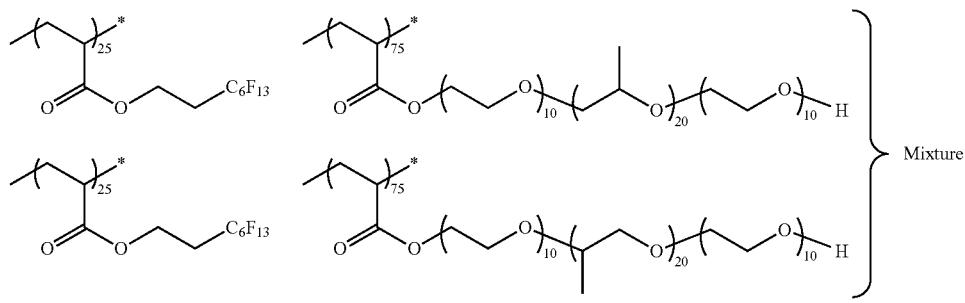

to cause actions such as electron transfer, energy transfer, and heat generation. As a result, the thermal-base generator, the thermal-radical polymerization initiator, or the photo-radical polymerization initiator undergoes a chemical change and decomposes, so that radicals, acids, or bases are generated. For details of the sensitizing dye, reference can be made to the description in paragraphs 0161 to 0163 of JP2016-027357A, the content of which is incorporated herein.

In a case where the composition according to the embodiment of the present invention contains a sensitizing dye, the content of the sensitizing dye is preferably 0.01% to 20% by mass, with respect to the total solid content of the composition according to the embodiment of the present invention, more preferably, 0.1% to 15% by mass, and still more preferably 0.5% to 10% by mass. For the sensitizing dye, one type may be used alone, or two or more types may be used in combination.

<<<Chain Transfer Agent>>>

The composition according to the embodiment of the present invention may contain a chain transfer agent. The chain transfer agent is defined, for example, in Polymer Dictionary, 3rd Edition, pp. 683 to 684 (edited by The Society of Polymer Science, 2005). As the chain transfer agent, for example, a group of compounds having SH, PH, SiH, or GeH in a molecule is used. These can donate a hydrogen to a low active radical to generate a radical, or can be oxidized and then deprotonated to generate a radical. In particular, thiol compounds (for example, 2-mercaptobenzimidazoles, 2-mercaptobenzothiazoles, 2-mercaptobenzoxazoles, 3-mercaptotriazoles, and 5-mercaptotetrazoles) can be preferably used.

In a case where the composition according to the embodiment of the present invention has a surfactant, the content of the surfactant is preferably 0.001% to 2.0% by mass, with respect to the total solid content of the composition according to the embodiment of the present invention, and more preferably 0.005% to 1.0% by mass. For the surfactant, only one type may be used, or two or more types may be used. In a case where two or more types of surfactants are used, a total thereof is preferably within the above-mentioned range.

<<<Higher Fatty Acid Derivative>>>

In the composition according to the embodiment of the present invention, in order to prevent polymerization inhibition due to oxygen, a higher fatty acid derivative such as behenic acid or behenic acid amide is added and is caused to be localized on a surface of the composition in the course of drying after coating.

In a case where the composition according to the embodiment of the present invention has a higher fatty acid derivative, the content of the higher fatty acid derivative is preferably 0.1% to 10% by mass with respect to the total solid content of the composition according to the embodiment of the present invention. For the higher fatty acid derivative, only one type may be used, or two or more types may be used. In a case where two or more higher fatty acid derivatives are used, a total thereof is preferably within the above-mentioned range.

<<Restriction on Other Substances to be Contained>>

A water content of the composition according to the embodiment of the present invention is preferably less than 5% by mass, more preferably less than 1% by mass, and particularly preferably less than 0.6% by mass, from the viewpoint of properties of a coated surface.

From the viewpoint of insulating properties, the metal content of the composition according to the embodiment of the present invention is preferably less than 5 parts per million (ppm) by mass, more preferably less than 1 ppm by mass, and particularly preferably less than 0.5 ppm by mass. As the metal, sodium, potassium, magnesium, calcium, iron, chromium, nickel, and the like are mentioned. In a case where a plurality of metals are contained, a total of these metals is preferably within the above-mentioned range.

In addition, as a method of reducing metal impurities which are unintentionally contained in the composition according to the embodiment of the present invention, a method of selecting a raw material which contains a low metal content as the raw material constituting the composition according to the embodiment of the present invention, a method of filtering the raw material constituting the composition according to the embodiment of the present invention, a method of distilling under the condition in which the inside of the device is lined with polytetrafluoroethylene or the like to suppress the contamination as little as possible, and the like can be mentioned.

In the composition according to the embodiment of the present invention, a content of halogen atoms is preferably less than 500 ppm by mass, more preferably less than 300 ppm by mass, and particularly preferably less than 200 ppm by mass, from the viewpoint of wiring corrosiveness. Among these, in a case of being present in a halogen ion state, the content is preferably less than 5 ppm by mass, more preferably less than 1 ppm by mass, and still more preferably less than 0.5 ppm by mass. As the halogen atom, a chlorine atom and a bromine atom are mentioned. It is preferable that each of the chlorine atom and the bromine atom, or a total of the chlorine ion and the bromine ion is within the above-mentioned range.

As a storage container of the composition according to the embodiment of the present invention, a conventionally known storage container can be used. In addition, as the storage container, for the purpose of suppressing incorporation of impurities into raw materials and the composition, a multilayer bottle in which an inner wall of a container is composed of six types of six layers of resin, and a bottle with six types of resin being made as a seven-layer structure are preferably used. As such a container, for example, the container described in JP2015-123351A can be mentioned.

<<Preparation of Composition>>

The composition according to the embodiment of the present invention can be prepared by mixing the above-mentioned components. A mixing method is not particularly limited, and mixing can be carried out by methods known in the related art.

In addition, for the purpose of removing foreign substances such as dust and fine particles in the composition, it is preferable to carry out filtration using a filter after blending each component. A filter pore size is preferably 1 m or lower, more preferably 0.5 m or lower, and still more preferably 0.1 m or lower. A material of the filter is preferably polytetrafluoroethylene, polyethylene, or nylon. As the filter, a filter which has been previously washed with an organic solvent may be used. In a filtration step using a filter, a plurality of type of filters may be connected in series or in parallel and used. In a case where a plurality of types of filters are used, filters having different pore sizes and/or different materials may be used in combination. In addition, various materials may be filtered a plurality of times. In a case of being filtered a plurality of times, circulation filtration may be used. In addition, filtration may be carried out under pressure. In a case where filtration is carried out under pressure, the pressure is preferably 0.05 MPa to 0.3 MPa.

In addition to filtration using a filter, impurity removal treatment using an adsorbing material may be carried out. The filtration using a filter and the impurity removal treatment using an adsorbing material may be combined. As the adsorbing material, a known adsorbing material can be used. For example, an inorganic adsorbing material such as silica gel and zeolite, and an organic adsorbing material such as activated carbon are mentioned.

<Cured Film, Laminate, Semiconductor Device, Method for Producing Cured Film, and Method for Producing Laminate>

Next, a cured film, a laminate, a semiconductor device, a method for producing the cured film, and a method for producing the laminate are described.

The cured film according to the embodiment of the present invention is formed from the composition according to the embodiment of the present invention. A film thickness of the cured film according to the embodiment of the present invention can be, for example, 0.5 μm or higher, and 1 μm or higher. As an upper limit value, a film thickness of the cured film according to the embodiment of the present invention can be, for example, 100 μm or lower, and 30 μm or lower.

A laminate may have two or more layers of the cured film according to the embodiment of the present invention. A laminate having two or more layers of the cured film according to the embodiment of the present invention preferably has a metal layer between the cured films. Such a metal layer is preferably used as a metal wiring such as a re-distribution layer.

As a field to which the cured film of the embodiment of the present invention can be applied, an insulating film of a semiconductor device, an interlayer insulating film for a re-distribution layer, and the like are mentioned. In particular, due to good resolution properties, the cured film of the embodiment of the present invention can be preferably used for an interlayer insulating film for a re-distribution layer in a three-dimensional mounting device.

In addition, the cured film according to the embodiment of the present invention can also be used for photoresist for electronics, galvanic (electrolytic) resist, etching resist, solder top resist, and the like.

In addition, the cured film according to the embodiment of the present invention can also be used for production of board surfaces such as an offset board surface or a screen board surface, for etching of molded parts, for production of protective lacquers and dielectric layers in electronics, in particular, microelectronics, and the like.

The method for producing a cured film according to the embodiment of the present invention includes using the composition according to the embodiment of the present invention. Preferably, a method for producing a cured film which has a photosensitive resin composition layer forming step of applying the photosensitive resin composition according to the embodiment of the present invention to a substrate to form a layer, an exposure step of exposing the photosensitive resin composition layer, and a development treatment step of subjecting the exposed photosensitive resin composition layer (resin layer) to a development treatment is mentioned. The photosensitive resin composition according to the embodiment of the present invention is preferably used in case of performing development, particularly, performing development using an organic solvent.

The method for producing a laminate of the embodiment of the present invention includes a method for producing a cured film of the embodiment of the present invention. The method for producing a laminate of the embodiment of the present invention preferably includes forming a cured film in accordance with the method for producing a cured film of the embodiment of the present invention, and then further performing, again, the photosensitive resin composition layer forming step, the exposure step, and the development treatment step, in this order. In particular, it is preferable that the photosensitive resin composition layer forming step, the exposure step, and the development treatment step are further carried out, in this order, 2 to 5 times (that is, 3 to 6 times in total). By laminating the cured film in this manner, a laminate can be obtained. In the embodiment of the present invention, in particular, it is preferable to provide a metal layer on a portion which has been removed by a developer, after the cured film is provided and developed.

The details thereof will be described below.

<<Photosensitive Resin Composition Layer Forming Step>>

The method for producing a laminate according to the embodiment of the present invention includes a photosensitive resin composition layer forming step of applying a photosensitive resin composition to a substrate to form a layer.

The type of substrate can be appropriately determined depending on the application, such as a semiconductor production substrate such as silicon, silicon nitride, polysilicon, silicon oxide, amorphous silicon, quartz, glass, an optical film, a ceramic material, a vapor deposited film, a magnetic film, a reflective film, a metal substrate such as Ni, Cu, Cr, or Fe, paper, a spin on glass (SOG), a thin film transistor (TFT) array substrate, and an electrode plate of a plasma display panel (PDP), and is not particular limited thereto. In the present invention, in particular, the semiconductor production substrate is preferable, and the silicon substrate is more preferable.

In a case where the photosensitive resin composition layer is formed on a surface of a resin layer or on a surface of the metal layer, the resin layer or the metal layer is the substrate.

As a means to apply the photosensitive resin composition to the substrate, coating is preferable.

Specifically, as means for application, a dip coating method, an air knife coating method, a curtain coating method, a wire bar coating method, a gravure coating method, an extrusion coating method, a spray coating method, a spin coating method, a slit coating method, and an inkjet method are exemplified. From the viewpoint of uniformity of the thickness of the photosensitive resin composition layer, the spin coating, the slit coating, the spray coating, and the inkjet are more preferable. A resin layer having a desired thickness can be obtained by appropriately adjusting a concentration of the solid content and application conditions according to the method. In addition, the coating method can be appropriately selected depending on the shape of the substrate. In a case where a circular substrate such as a wafer is used, the spin coating method, the spray coating method, the inkjet method, and the like are preferable, and in a case where a rectangular substrate is used, the slit coating method, the spray coating method, the inkjet method, and the like are preferable. For example, the spin coating method can be applied at a rotation speed of 500 to 2000 rpm for about 10 seconds to 1 minute.

<<Drying Step>>

The method for producing a laminate according to the embodiment of the present invention may include a step of drying to remove the solvent after forming the photosensitive resin composition layer. A preferred drying temperature is 50° C. to 150° C., more preferably 70° C. to 130° C., and still more preferably 90° C. to 110° C. A drying time is, for example, 30 seconds to 20 minutes, preferably 1 minute to 10 minutes, and more preferably 3 minutes to 7 minutes.

<<Exposure Step>>

The method for producing the laminate according to the embodiment of the present invention includes an exposure step of exposing the photosensitive resin composition layer. The amount of exposure is not particularly limited as long as the photosensitive resin composition can be cured, and for example, irradiation with 100 to 10000 mJ/cm$^2$ is preferable, and irradiation with 200 to 8000 mJ/cm$^2$ is more preferable, in terms of conversion of exposure energy at a wavelength of 365 nm.

The exposure wavelength can be appropriately determined in the range of 190 to 1000 nm, preferably 240 to 550 nm.

In the present invention, it is preferable not to include a step of heating at 40° C. or more between the exposure step and the development treatment step.

<<Development Treatment Step>>

The method for producing the laminate according to the embodiment of the present invention includes a development treatment step of performing development treatment on the exposed photosensitive resin composition layer. By performing development, an unexposed portion (non-exposed portion) is removed. The development method is not particularly limited as long as the development method can form a desired pattern, and, for example, a development method such as puddle, spray, immersion, and ultrasonic waves can be employed.

Development is performed using a developer. The developer can be used without particular limitation as long as the unexposed portion (non-exposed portion) is removed. The developer preferably contains an organic solvent. In the present invention, the developer preferably contains an organic solvent having a Clog P of −1 to 5, and more preferably an organic solvent having a Clog P of 0 to 3. A Clog P can be obtained as a calculated value by inputting a structural formula in ChemBioDraw.

The organic solvents, for example, esters such as ethyl acetate, n-butyl acetate, amyl formate, isoamyl acetate, isobutyl acetate, butyl propionate, isopropyl butyrate, ethyl butyrate, butyl butyrate, methyl lactate, ethyl lactate, γ-butyrolactone, ε-caprolactone, 6-valerolactone, alkyl alkyloxyacetate (example: methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), 3-alkyloxypropionic acid alkyl esters (example: methyl 3-alkyloxypropionate, ethyl 3-alkyloxypropionate (for example, methyl 3-methoxypropionate, ethyl 3-methoxypropionate, methyl 3-ethoxypropionate, and ethyl 3-ethoxypropionate)), 2-alkyloxypropionic acid alkyl esters (example: methyl 2-alkyloxypropionate, ethyl 2-alkyloxypropionate, and propyl 2-alkyl oxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methylpropionate and ethyl 2-alkyloxy-2-methylpropionate (for example, methyl 2-methoxy-2-methylpropionate, and ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate, and ethers, for example, such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate, and ketones, for example, such as methyl ethyl ketone, cyclohexanone, cyclopentanone, 2-heptanone, 3-heptanone, and N-methyl-2-pyrrolidone, and aromatic hydrocarbons, for example, such as toluene, xylene, anisole, and limonene, and sulfoxides such as dimethyl sulfoxide are suitably mentioned.

In the present invention, cyclopentanone and γ-butyrolactone are particularly preferable, and cyclopentanone is more preferable.

A developer is preferably 50% by mass or more of an organic solvent, more preferably 70% by mass or more of an organic solvent, and still more preferably 90% by mass or more of an organic solvent. In addition, a developer may be 100% by mass of an organic solvent.

The development time is preferably 10 seconds to 5 minutes. The temperature at the time of development is not particularly limited, and the development can usually be performed at 20° C. to 40° C.

After treating with the developer, a rinsing may be further performed. The rinsing is preferably performed with a solvent different from the developer. For example, the rinsing can be performed using the solvent contained in the photosensitive resin composition. The rinsing time is preferably 5 seconds to 1 minute.

<<Heating Step>>

The method for producing the laminate according to the embodiment of the present invention preferably includes a heating step after development. In the heating step, a cyclization reaction of the polymer precursor proceeds. In addition, in a case where the composition according to the embodiment of the present invention contains a radically polymerizable compound other than the polymer precursor, curing of a radically polymerizable compound other than the polymer precursor, which is not reacted, also proceeds. The heating temperature (maximum heating temperature) is preferably 50° C. to 450° C., more preferably 140° C. to 400° C., and still more preferably 160° C. to 350° C.

The heating is preferably performed at a temperature elevation rate of 1° C. to 12° C./min from the temperature at the start of heating to the maximum heating temperature, more preferably 2° C. to 10° C./min, and still more preferably 3° C. to 10° C./min. By setting the temperature elevation rate to 1° C./min or higher, excessive volatilization of the amine can be prevented while securing productivity, and by setting the temperature elevation rate to 12° C./min or lower, residual stress of the cured film can be relieved.

The temperature at the start of heating is preferably 20° C. to 150° C., more preferably 20° C. to 130° C., and still more preferably 25° C. to 120° C. The temperature at the start of heating refers to a temperature at which the step of heating to the maximum heating temperature is started. For example, in a case where the photosensitive resin composition is applied on a substrate and then dried, the temperature at the start of heating is the temperature after drying, and for example it is preferable to gradually raise the temperature from the boiling point of the solvent (30° C. to 200° C.) contained in the photosensitive resin composition.

The heating time (heating time at the maximum heating temperature) is preferably 10 to 360 minutes, more preferably 20 to 300 minutes, and particularly preferably 30 to 240 minutes.

Particularly, in the case of forming a multilayer laminate, the heating is preferably performed at 180° C. to 320° C., and more preferably 180° C. to 260° C., from the viewpoint of adhesiveness between the cured films. Although the reason is not clear, it is considered that, at this temperature, the ethynyl groups of the polymer precursor between layers mutually undergo a crosslinking reaction.

The heating may be performed stepwise. As an example, a pretreatment step may be performed, in which the temperature is raised from 25° C. to 180° C. at 3° C./min, held at 180C for 60 minutes, raised from 180° C. to 200° C. at 2° C./min, held at 200° C. for 120 minutes, and the like may be performed. The heating temperature as the pretreatment step is preferably 100° C. to 200° C., more preferably 110° C. to 190° C., and still more preferably 120° C. to 185° C. In the pretreatment step, it is also preferable to perform the treatment while irradiating with ultraviolet ray as described in U.S. Pat. No. 9,159,547B. By such a pretreatment step, it is possible to improve the properties of the film. The pretreatment step may be performed for a short time of about 10 seconds to two hours, and more preferably 15 seconds to 30 minutes. The pretreatment may be performed in two or more steps, for example, the pretreatment step 1 may be performed in the range of 100° C. to 150° C., and then the pretreatment step 2 may be performed in the range of 150° C. to 200° C.

Furthermore, it may be cooled after heating, and the cooling rate in this case is preferably 1 to 5° C./min.

It is preferable that the heating step is performed in an atmosphere of low oxygen concentration by flowing an inert gas such as nitrogen, helium, argon or the like, from the viewpoint of preventing the decomposition of the polymer precursor. The oxygen concentration is preferably 50 ppm (volume ratio) or lower, and more preferably 20 ppm (volume ratio) or lower.

<<Metal Layer Forming Step>>

It is preferable that the method for producing the laminate according to the embodiment of the present invention includes a metal layer forming step of forming a metal layer on the surface of the photosensitive resin composition layer after development treatment.

As the metal layer, while existing metal types can be used without particular limitation, copper, aluminum, nickel, vanadium, titanium, chromium, cobalt, gold and tungsten are exemplified, copper and aluminum are more preferable, and copper is even more preferable.

The method of forming the metal layer does not have a particular limitation, and the existing method can be applied. For example, the methods disclosed in JP2007-157879A, JP2001-521288A, JP2004-214501A, and JP2004-101850A can be used. For example, photolithography, lift-off, electrolytic plating, electroless plating, etching, printing, and methods combining these may be considered. More specifically, examples of the method of forming the metal layer may include a patterning method combining sputtering, photolithography and etching, and a patterning method combining photolithography and electrolytic plating.

The thickness of the metal layer is preferably 0.1 to 50 μm, and more preferably 1 to 10 μm at the thickest part.

<<Laminating Step>>

The production method according to the embodiment of the present invention preferably further includes a laminating step.

The laminating step is a series of steps including performing the photosensitive resin composition layer forming step, the exposure step, and the development treatment step in this order. It is needless to say that the laminating step may further include the above-mentioned drying step, heating step, and the like.

In a case where the laminating step is further performed after the laminating step, a surface activation treatment step may be further performed after the exposure step or the metal layer forming step. Plasma treatment is exemplified as the surface activation treatment.

The laminating step is preferably performed 2 to 5 times, and more preferably 3 to 5 times.

For example, a configuration having 3 to 7 resin layers such as a resin layer/a metal layer/a resin layer/a metal layer/a resin layer/a metal layer is preferable, and a configuration having 3 to 5 resin layers is more preferable.

That is, particularly in the present invention, it is preferable that the photosensitive resin composition layer forming step, the exposure step, and the development treatment step are further performed in this order so as to cover the metal layer, after the metal layer is provided. By alternately performing the laminating step of laminating the photosensitive resin composition layer (resin) and the metal layer forming step, the photosensitive resin composition layer (resin layer) and the metal layer can be alternately laminated.

In the present invention, a semiconductor device including the cured film or the laminate according to the embodiment of the present invention is also disclosed. An embodiment of a semiconductor device in which the composition according to the embodiment of the present invention is used for forming an interlayer insulating film for a re-distribution layer is described.

A semiconductor device 100 shown in FIG. 1 is a so-called three-dimensional mounting device. A laminate 101 in which a plurality of semiconductor elements (semiconductor chips) 101a to 101d are laminated is disposed on a wiring board 120. In this embodiment, a case where the number of laminated semiconductor elements (semiconductor chips) is four is mainly described. However, the number of laminated semiconductor elements (semiconductor chips) is not particularly limited, and may be 2 layers, 8 layers, 16 layers, 32 layers, or the like. In addition, the number of laminated semiconductor may be one layer.

Each of the plurality of semiconductor elements 101a to 101d is made of a semiconductor wafer such as a silicon substrate. The uppermost semiconductor element 101a does not have a through-electrode, and an electrode pad (not shown) is formed on one surface thereof. The semiconductor elements 101b to 101d have through-electrodes 102b to 102d, and connection pads (not shown) provided integrally with the through-electrodes are provided on both surfaces of each semiconductor element.

The laminate 101 has a structure in which a semiconductor element 101a having no through-electrode and semiconductor elements 101b to 101d having through-electrodes 102b to 102d are connected by flip-chip. That is, an electrode pad of the semiconductor element 101a having no through-electrode and one connection pad of the semiconductor element 101b, close to the semiconductor element 101a, which is adjacent to the semiconductor element 101a and has the through-electrode 102b are connected by a metal bump 103a such as a solder bump, and the other connection pad of the semiconductor element 101b having the through-electrode 102b and a connection pad of the semiconductor element 101c, close to the semiconductor element 101b, which is adjacent to the semiconductor element 101b and has a through-electrode 102c are connected by a metal bump 103b such as a solder bump.

Similarly, the connection pad on the other side of the semiconductor element 101c having the through-electrode 102c is connected to the connection pad on the semiconductor element 101c side of the semiconductor element 101d having the adjacent through-electrode 102d by the metal bump 103c such as a solder bump.

An underfill layer 110 is formed in each gap between the semiconductor elements 101a to 101d, and the semiconductor elements 101a to 101d are laminated with the underfill layer 110 interposed therebetween.

The laminate 101 is laminated on the wiring board 120. As the wiring board 120, for example, a multilayer wiring board using an insulating substrate such as a resin substrate, a ceramic substrate, or a glass substrate as a base material is used. Examples of the wiring board 120 to which the resin substrate is applied include a multilayer copper-clad laminate (multilayer printed wiring board).

A surface electrode 120a is provided on one surface of the wiring board 120.

An insulating film 115 in which the re-distribution layer 105 is formed is disposed between the wiring board 120 and the laminate 101, and the wiring board 120 and the laminate 101 are electrically connected through the re-distribution layer 105. The insulating film 115 is formed using the composition according to the embodiment of the present invention.

That is, one end of the re-distribution layer 105 is connected to an electrode pad formed on the surface of the semiconductor element 101d, which is close to the re-distribution layer 105, through a metal bump 103d such as a solder bump. The other end of the re-distribution layer 105 is connected to the surface electrode 120a of the wiring board through a metal bump 103e such as a solder bump.

An underfill layer 110a is formed between the insulating film 115 and the laminate 101. In addition, an underfill layer 110b is formed between the insulating film 115 and the wiring board 120.

EXAMPLES

Hereinafter, the present invention will be described more specifically with reference to examples. Materials, amounts used, proportions, treatment details, treatment procedures, and the like shown in the following examples can be appropriately changed without departing from the gist of the present invention. Accordingly, a scope of the present invention is not limited to the following specific examples. "Parts" and "%" are on a mass basis unless otherwise stated.

Synthesis Example 1

Synthesis of Polyimide Precursor A-1 from 4,4'-Oxydiphthalic Acid Dianhydride, 2-hydroxyethyl Methacrylate and Diamine (a) Shown Below 21.2 g of 4,4'-oxydiphthalic acid dianhydride, 18.0 g of 2-hydroxyethyl methacrylate, 23.9 g of pyridine, 1 mg of water, and 250 mL of diglyme (diethylene glycol dimethyl ether) were mixed, stirred at a temperature of 60° C. for 4 hours, and then a diester of 4,4'-oxydiphthalic acid dianhydride and 2-hydroxyethyl methacrylate was produced. As a result of measuring a water content of the obtained reaction solution, water was contained at 120 ppm by mass. The reaction mixture was then cooled to −10° C. and 17.0 g of $SOCl_2$ was added over 60 minutes, keeping the temperature at −10° C. After diluting with 50 mL of N-methylpyrrolidone, a solution in which 38.0 g of the hydroxyl group-containing diamine (a) shown below was dissolved in 100 mL of N-methylpyrrolidone was added dropwise to the reaction mixture over 60 minutes at −10° C., the mixture was stirred for 2 hours, and then 20 mL of ethyl alcohol was added. The polyimide precursor was then sedimented in 6 liters of water and the water-polyimide precursor mixture was stirred for 15 minutes. The solid of the polyimide precursor was filtered and dissolved in 380 g of tetrahydrofuran. The resulting solution was sedimented in 6 liters of water, filtered, and dried at 45° C. under reduced pressure for 3 days to obtain solid powder of a polyimide precursor. The polyimide precursor had a weight-average molecular weight of 29,400, a number-average molecular weight of 10,800 and an acid value of 5.6 mgKOH/g.

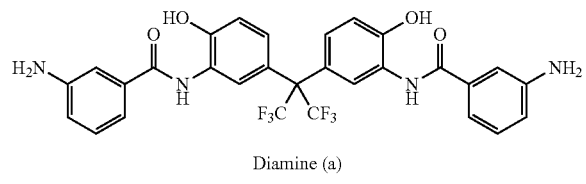 [SMILES: Nc1cccc(C(=O)Nc2cc(C(c3ccc(O)c(NC(=O)c4cccc(N)c4)c3)(C(F)(F)F)C(F)(F)F)ccc2O)c1]

Diamine (a)

Synthesis Example 2

Synthesis of Polyimide Precursor A-2 from Pyromellitic Acid Dianhydride, 2-hydroxyethyl Methacrylate and 4,4'-diamino-2,2'-bis (Trifluoromethyl) Biphenyl 14.9 g of pyromellitic acid dianhydride, 18.0 g of 2-hydroxyethyl methacrylate, 23.9 g of pyridine, 2 mg of water, and 250 mL of diglyme were mixed, stirred at a temperature of 60° C. for 4 hours, and then a diester of pyromellitic acid dianhydride and 2-hydroxyethyl methacrylate was produced. As a result of measuring a water content of the obtained reaction solution, water was contained at 232 ppm by mass. The reaction mixture was then cooled to −10° C. and 17.0 g of SOCl$_2$ was added over 60 minutes, keeping the temperature at −10° C. After diluting with 50 mL of N-methylpyrrolidone, a solution in which 20.1 g of 4,4'-diamino-2,2'-bis (trifluoromethyl) biphenyl was dissolved in 100 mL of N-methylpyrrolidone was added dropwise to the reaction mixture over 60 minutes at −10° C., the mixture was stirred for 2 hours, and then 20 mL of ethyl alcohol was added. The polyimide precursor was then sedimented in 6 liters of water and the water-polyimide precursor mixture was stirred for 15 minutes. The solid of the polyimide precursor was filtered and dissolved in 380 g of tetrahydrofuran. The resulting solution was sedimented in 6 liters of water, filtered, and dried at 45° C. under reduced pressure for 3 days to obtain solid powder of a polyimide precursor. The polyimide precursor had a weight-average molecular weight of 26,100, a number-average molecular weight of 9,900 and an acid value of 10.2 mgKOH/g.

Synthesis Example 3

Synthesis of Polyimide Precursor A-3 from 4,4'-oxydiphthalic Acid Dianhydride, 2-hydroxyethyl Methacrylate and 4,4'-diamino-2,2'-bis (trifluoromethyl) Biphenyl 21.2 g of 4,4'-oxydiphthalic acid dianhydride, 18.0 g of 2-hydroxyethyl methacrylate, 23.9 g of pyridine, 0.5 mg of water, and 250 mL of diglyme were mixed, stirred at a temperature of 60° C. for 4 hours, and then a diester of 4,4'-oxydiphthalic acid dianhydride and 2-hydroxyethyl methacrylate was produced. As a result of measuring a water content of the obtained reaction solution, water was contained at 88 ppm by mass. The reaction mixture was then cooled to −10° C. and 17.0 g of SOCl$_2$ was added over 60 minutes, keeping the temperature at −10° C. After diluting with 50 mL of N-methylpyrrolidone, a solution in which 20.1 g of 4,4'-diamino-2,2'-bis (trifluoromethyl) biphenyl was dissolved in 100 mL of N-methylpyrrolidone was added dropwise to the reaction mixture over 60 minutes at −10° C., the mixture was stirred for 2 hours, and then 20 mL of ethyl alcohol was added. The polyimide precursor was then sedimented in 6 liters of water and the water-polyimide precursor mixture was stirred for 15 minutes. The solid of the polyimide precursor was filtered and dissolved in 380 g of tetrahydrofuran. The resulting solution was sedimented in 6 liters of water, filtered, and dried at 45° C. under reduced pressure for 3 days to obtain solid powder of a polyimide precursor. The polyimide precursor had a weight-average molecular weight of 24,500, a number-average molecular weight of 9,500 and an acid value of 3.6 mgKOH/g.

Synthesis Example 4

Synthesis of Polyimide Precursor A-4 from 4,4'-oxydiphthalic Acid Dianhydride, 2-hydroxyethyl Methacrylate and 4,4'-diaminodiphenyl Ether 21.2 g of 4,4'-oxydiphthalic acid dianhydride, 18.0 g of 2-hydroxyethyl methacrylate, 23.9 g of pyridine, 1 mg of water, and 250 mL of diglyme were mixed, stirred at a temperature of 60° C. for 4 hours, and then a diester of 4,4'-oxydiphthalic acid dianhydride and 2-hydroxyethyl methacrylate was produced. As a result of measuring a water content of the obtained reaction solution, water was contained at 133 ppm by mass. The reaction mixture was then cooled to −10° C. and 17.0 g of SOCl$_2$ was added over 60 minutes, keeping the temperature at −10° C. After diluting with 50 mL of N-methylpyrrolidone, a solution in which 25.1 g of 4,4'-diaminodiphenyl ether was dissolved in 100 mL of N-methylpyrrolidone was added dropwise to the reaction mixture over 60 minutes at −10° C. Then, the reaction mixture was stirred for 2 hours and 20 ml of ethyl alcohol was added thereto. The polyimide precursor was then sedimented in 6 liters of water and the water-polyimide precursor mixture was stirred for 15 minutes. The solid of the polyimide precursor was filtered and dissolved in 380 g of tetrahydrofuran. The resulting solution was sedimented in 6 liters of water, filtered, and dried at 45° C. under reduced pressure for 3 days to obtain solid powder of a polyimide precursor. The polyimide precursor had a weight-average molecular weight of 23,300, a number-average molecular weight of 9,600 and an acid value of 5.7 mgKOH/g.

Synthesis Example 5

Synthesis of Polybenzoxazole Precursor A-5 from 2,2'-bis (3-amino-4-hydroxyphenyl) Hexafluoropropane and 4,4'-oxydibenzoyl Chloride 28.0 g of 2,2'-bis (3-amino-4-hydroxyphenyl) hexafluoropropane was stirred, dissolved in 200 mL of N-methylpyrrolidone, and 3 mg of water added thereto. As a result of measuring a water content of the obtained reaction solution, water was contained at 332 ppm by mass. Subsequently, 25.0 g of 4,4'-oxydibenzoyl chloride was added dropwise over 30 minutes while maintaining the temperature at 0° C. to 5° C., and stirring was continued for 60 minutes. 6 L of water was added to the resulting reaction solution to sediment the polybenzoxazole precursor. The solid was filtered and dried under reduced pressure at 45C for 2 days to obtain solid powder of a polybenzoxazole precursor. The obtained powdery polybenzoxazole precursor had a weight-average molecular weight of 25,500, a number-average molecular weight of 9,200, and an acid value of 13.2 mgKOH/g.

Synthesis Example 6

Synthesis of Polyimide Precursor A-6 from 4,4'-oxydiphthalic Acid Dianhydride, 2-hydroxyethyl Methacrylate and 4,4'-diamino-2,2'-bis (trifluoromethyl) Biphenyl 21.2 g of 4,4'-oxydiphthalic acid dianhydride, 18.0 g of 2-hydroxyethyl methacrylate, 23.9 g of pyridine, 7 mg of water, and 250 mL of diglyme were mixed, stirred at a temperature of 60° C. for 4 hours, and then a diester of 4,4'-oxydiphthalic acid dianhydride and 2-hydroxyethyl methacrylate was produced. As a result of measuring a water content of the obtained reaction solution, water was contained at 652 ppm by mass. The reaction mixture was then cooled to −10° C. and 17.0 g of $SOCl_2$ was added over 60 minutes, keeping the temperature at −10° C. After diluting with 50 mL of N-methylpyrrolidone, a solution in which 20.1 g of 4,4'-diamino-2,2'-bis (trifluoromethyl) biphenyl was dissolved in 100 mL of N-methylpyrrolidone was added dropwise to the reaction mixture over 60 minutes at −10° C., the mixture was stirred for 2 hours, and then 20 mL of ethyl alcohol was added. The polyimide precursor was then sedimented in 6 liters of water and the water-polyimide precursor mixture was stirred for 15 minutes. The solid of the polyimide precursor was filtered and dissolved in 380 g of tetrahydrofuran. The resulting solution was sedimented in 6 liters of water, filtered, and dried at 45° C. under reduced pressure for 3 days to obtain solid powder of a polyimide precursor. The polyimide precursor had a weight-average molecular weight of 22,500, a number-average molecular weight of 9,100 and an acid value of 22.2 mgKOH/g.

Synthesis Example 7

Synthesis of Polyimide Precursor A-7 from 4,4'-oxydiphthalic Acid Dianhydride, 2-hydroxyethyl Methacrylate and 4,4'-diamino-2,2'-bis (trifluoromethyl) Biphenyl 21.2 g of 4,4'-oxydiphthalic acid dianhydride, 18.0 g of 2-hydroxyethyl methacrylate, 23.9 g of pyridine, 2 mg of water, and 250 mL of diglyme were mixed, stirred at a temperature of 60° C. for 4 hours, and then a diester of 4,4'-oxydiphthalic acid dianhydride and 2-hydroxyethyl methacrylate was produced. As a result of measuring a water content of the obtained reaction solution, water was contained at 242 ppm by mass. The reaction mixture was then cooled to −10° C. and 17.0 g of $SOCl_2$ was added over 60 minutes, keeping the temperature at −10° C. After diluting with 50 mL of N-methylpyrrolidone, a solution in which 20.1 g of 4,4'-diamino-2,2'-bis (trifluoromethyl) biphenyl was dissolved in 100 mL of N-methylpyrrolidone was added dropwise to the reaction mixture over 60 minutes at −10° C., the mixture was stirred for 2 hours, and then 20 mL of ethyl alcohol was added. The polyimide precursor was then sedimented in 6 liters of water and the water-polyimide precursor mixture was stirred for 15 minutes. The solid of the polyimide precursor was filtered and dissolved in 380 g of tetrahydrofuran. The resulting solution was sedimented in 6 liters of water, filtered, and dried at 45° C. under reduced pressure for 3 days to obtain solid powder of a polyimide precursor. The polyimide precursor had a weight-average molecular weight of 25,100, a number-average molecular weight of 9,800 and an acid value of 7.8 mgKOH/g.

Synthesis Example 8

Synthesis of Polyimide Precursor A-8 from 4,4'-oxydiphthalic Acid Dianhydride, 2-hydroxyethyl Methacrylate and 4,4'-diamino-2,2'-bis (trifluoromethyl) Biphenyl 21.2 g of 4,4'-oxydiphthalic acid dianhydride, 18.0 g of 2-hydroxyethyl methacrylate, 23.9 g of pyridine, 5 mg of water, and 250 mL of diglyme were mixed, stirred at a temperature of 60° C. for 4 hours, and then a diester of 4,4'-oxydiphthalic acid dianhydride and 2-hydroxyethyl methacrylate was produced. As a result of measuring a water content of the obtained reaction solution, water was contained at 552 ppm by mass. The reaction mixture was then cooled to −10° C. and 17.0 g of $SOCl_2$ was added over 60 minutes, keeping the temperature at −10° C. After diluting with 50 mL of N-methylpyrrolidone, a solution in which 20.1 g of 4,4'-diamino-2,2'-bis (trifluoromethyl) biphenyl was dissolved in 100 mL of N-methylpyrrolidone was added dropwise to the reaction mixture over 60 minutes at −10° C., the mixture was stirred for 2 hours, and then 20 mL of ethyl alcohol was added. The polyimide precursor was then sedimented in 6 liters of water and the water-polyimide precursor mixture was stirred for 15 minutes. The solid of the polyimide precursor was filtered and dissolved in 380 g of tetrahydrofuran. The resulting solution was sedimented in 6 liters of water, filtered, and dried at 45° C. under reduced pressure for 3 days to obtain solid powder of a polyimide precursor. The polyimide precursor had a weight-average molecular weight of 24,500, a number-average molecular weight of 9,500 and an acid value of 16.5 mgKOH/g.

Synthesis Example 9

Synthesis of Polybenzoxazole Precursor A-9 from 2,2'-bis (3-amino-4-hydroxyphenyl) Hexafluoropropane and 4,4'-oxydibenzoyl Chloride 28.0 g of 2,2'-bis (3-amino-4-hydroxyphenyl) hexafluoropropane was stirred and dissolved in 200 mL of N-methylpyrrolidone. As a result of measuring a water content of the obtained reaction solution, water was contained at 45 ppm by mass. Subsequently, 25.0 g of 4,4'-oxydibenzoyl chloride was added dropwise over 30 minutes while maintaining the temperature at 0° C. to 5° C., and stirring was continued for 60 minutes. 6 L of water was added to the resulting reaction solution to sediment the polybenzoxazole precursor. The solid was filtered and dried under reduced pressure at 45° C. for 2 days to obtain solid powder of a polybenzoxazole precursor. The obtained powdery polybenzoxazole precursor had a weight-average molecular weight of 25,500, a number-average molecular weight of 9,200, and an acid value of 1.8 mgKOH/g.

Synthesis Example 10

Synthesis of Polyimide Precursor A-10 from Pyromellitic Acid Dianhydride, 2-hydroxyethyl Methacrylate and 4,4'-diamino-2,2'-bis (trifluoromethyl) Biphenyl 14.9 g of pyromellitic acid dianhydride, 18.0 g of 2-hydroxyethyl methacrylate, 23.9 g of pyridine and 250 mL of diglyme were mixed, stirred at a temperature of 60° C. for 4 hours, and then a diester of 4,4'-oxydiphthalic acid dianhydride and 2-hydroxyethyl methacrylate was produced. As a result of measuring a water content of the obtained reaction solution, water was contained at 42 ppm by mass. The reaction mixture was then cooled to −10° C. and 17.0 g of $SOCl_2$ was added over 60 minutes, keeping the temperature at −10° C. After diluting with 50 mL of N-methylpyrrolidone, a solution in which 20.1 g of 4,4'-diamino-2,2'-bis (trifluoromethyl) biphenyl was dissolved in 100 mL of N-methylpyrrolidone was added dropwise to the reaction mixture over 60 minutes at −10° C., the mixture was stirred for 2 hours, and then 20 mL of ethyl alcohol was added. The polyimide precursor was then sedimented in 6 liters of water and the water-polyimide precursor mixture was stirred for 15 minutes. The solid of the polyimide precursor was filtered and dissolved in 380 g of tetrahydrofuran. The resulting solution was sedimented in 6 liters of water, filtered, and dried at 45° C. under reduced pressure for 3 days to obtain solid powder of a polyimide precursor. The polyimide precursor had a weight-average molecular weight of 26,100, a number-average molecular weight of 9,900 and an acid value of 2.0 mgKOH/g.

Synthesis Example 11

Synthesis of Polyimide Precursor A-11 from 4,4'-oxydiphthalic Acid Dianhydride, 2-hydroxyethyl Methacrylate and 4,4'-diamino-2,2'-bis (trifluoromethyl) Biphenyl 21.2 g of 4,4'-oxydiphthalic acid dianhydride, 18.0 g of 2-hydroxyethyl methacrylate, 23.9 g of pyridine and 250 mL of diglyme were mixed, stirred at a temperature of 60° C. for 4 hours, and then a diester of 4,4'-oxydiphthalic acid dianhydride and 2-hydroxyethyl methacrylate was produced. As a result of measuring a water content of the obtained reaction solution, water was contained at 702 ppm by mass. The reaction mixture was then cooled to −10° C. and 17.0 g of $SOCl_2$ was added over 60 minutes, keeping the temperature at −10° C. After diluting with 50 mL of N-methylpyrrolidone, a solution in which 20.1 g of 4,4'-diamino-2,2'-bis (trifluoromethyl) biphenyl was dissolved in 100 mL of N-methylpyrrolidone was added dropwise to the reaction mixture over 60 minutes at −10° C., the mixture was stirred for 2 hours, and then 20 mL of ethyl alcohol was added. The polyimide precursor was then sedimented in 6 liters of water and the water-polyimide precursor mixture was stirred for 15 minutes. The solid of the polyimide precursor was filtered and dissolved in 380 g of tetrahydrofuran. The resulting solution was sedimented in 6 liters of water, filtered, and dried at 45° C. under reduced pressure for 3 days to obtain solid powder of a polyimide precursor. The polyimide precursor had a weight-average molecular weight of 25,100, a number-average molecular weight of 9,800 and an acid value of 34.2 mgKOH/g.

Synthesis Example 12

Synthesis of Polyimide Precursor A-12 from 4,4'-oxydiphthalic Acid Dianhydride, Ethyl Alcohol, and 4,4'-diaminodiphenyl Ether 21.2 g of 4,4'-oxydiphthalic acid dianhydride, 6.5 g of ethyl alcohol, 23.9 g of pyridine and 250 mL of diglyme were mixed, stirred at a temperature of 60° C. for 4 hours, and then a diester of 4,4'-oxydiphthalic acid dianhydride and ethyl alcohol was produced. As a result of measuring a water content of the obtained reaction solution, water was contained at 250 ppm by mass. The reaction mixture was then cooled to −10° C. and 17.0 g of $SOCl_2$ was added over 60 minutes, keeping the temperature at −10° C. After diluting with 50 mL of N-methylpyrrolidone, a solution in which 25.1 g of 4,4'-diaminodiphenyl ether was dissolved in 100 mL of N-methylpyrrolidone was added dropwise to the reaction mixture over 60 minutes at −10° C. Then, the reaction mixture was stirred for 2 hours and 20 mL of ethyl alcohol was added thereto. The polyimide precursor was then sedimented in 6 liters of water and the water-polyimide precursor mixture was stirred for 15 minutes. The solid of the polyimide precursor was filtered and dissolved in 380 g of tetrahydrofuran. The resulting solution was sedimented in 6 liters of water, filtered, and dried at 45° C. under reduced pressure for 3 days to obtain solid powder of a polyimide precursor. The polyimide precursor had a weight-average molecular weight of 20,300, a number-average molecular weight of 8,500 and an acid value of 8.9 mgKOH/g.

<Measurement of Water Content>

A water content of a reaction solution in the process of synthesizing a polymer precursor was measured according to the following method.

The water content of 1.0 g of reaction solution was measured by using a Karl Fischer moisture meter, MKC-510N (manufactured by Kyoto Electronics Manufacturing Co., Ltd.).

<Measurement of Weight-Average Molecular Weight and Number-Average Molecular Weight>

The weight-average molecular weight (Mw) and the number-average molecular weight (Mn) of a polymer precursor are polystyrene equivalent values by gel permeation chromatography (GPC) measurement, and were measured by the following method.

HLC-8220 (manufactured by Tosoh Co., Ltd.) was used as a measuring device, and guard column HZ-L, TSKgel Super HZM-M, TSKgel Super HZ4000, TSKgel Super HZ 3000, and TSKgel Super HZ 2000 (manufactured by Tosoh Co., Ltd) were used as columns. Measurement was performed at 40° C. at a flow rate of 0.35 mL/min using tetrahydrofuran (THF) as an eluent. Detection was performed using an ultraviolet-ray (UV) 254 nm detector. As a measurement sample, a sample in which the polymer precursor was diluted to 0.1% by mass with THF was used.

<Method of Measuring Acid Value>

The acid value of an acid group contained in the polymer precursor and having a neutralization point in a pH range of 7.0 to 12.0 was measured according to the following method.

0.3 g of solid powder of a polymer precursor obtained in the above synthesis examples was dissolved in a mixture solution of 80 mL of N-methylpyrrolidone and 1 mL of water, titrated by an automatic potentiometric titrator AT-510 (manufactured by Kyoto Electronics Manufacturing Co., Ltd.) using 0.01N of aqueous sodium hydroxide solution, and the acid value was calculated from a peak in a pH range of 7.0 to 12.0.

In case of using two or more types of polymer precursors were used, the acid value of each polymer precursor was calculated as a value calculated according to the mass ratio.

<Preparation of Photosensitive Resin Composition>

Each component described in Table 1 below was mixed to obtain a homogeneous solution, and filtered through a filter having a pore size of 0.8 μm under pressure of 0.3 MPa to obtain a photosensitive resin composition.

<Storage Stability>

10 g of the photosensitive resin composition was sealed in a container (container material: light shielding glass, volume: 100 mL), and was allowed to stand for a week in an environment of 25° C. and a relative humidity of 65%. Regarding each composition before and after storage for a week, the viscosity was measured at 25° C. using RE-85L (manufactured by Toki Sangyo Co., Ltd.), and the absolute value of rate of change in viscosity was calculated.

The smaller the rate of change is, the higher the stability of the photosensitive resin composition is, which is a preferred result.

A: 0% or more and less than 5%
B: 5% or more and less than 8%
C: 8% or more and less than 10%
D: 10% or more <Breaking Elongation>

The photosensitive resin composition was applied on a silicon wafer by spinning. A silicon wafer to which the photosensitive resin composition was applied was dried on a hot plate at 100° C. for 5 minutes to form a uniform film having a thickness of 10 m on the silicon wafer. Next, the film formed on the silicon wafer was exposed with an exposure energy of 400 mJ/cm² using a stepper (NSR2005i9C, manufactured by Nikon Corporation). The exposed resin composition layer (resin layer) was heated at temperature raised at a temperature elevation rate of 10° C./min under a nitrogen atmosphere, and after reaching 250° C., heating was performed for 3 hours. The cured resin layer was immersed in a 4.9% by mass hydrofluoric acid solution, and the resin layer was peeled from the silicon wafer to obtain a resin film.

The breaking elongation of the resin film was measured according to JIS-K6251 in a longitudinal direction of the film using a tensile tester (Tensilon) with a crosshead speed of 300 mm/min, a sample width of 10 mm, and a sample length of 50 mm in an environment of 25° C. and 65% relative humidity (RH). The breaking elongation in a longitudinal direction was independently measured five times, and the average value of the breaking elongation in a longitudinal direction was used for the evaluation.

A: 65% or more
B: 60% or more and less than 65%
C: 55% or more and less than 60%
D: 50% or more and less than 55%
E: Less than 50%

(A) Polymer Precursor
A-1 to A-12: Polymer precursor produced in Synthesis Examples 1 to 12

(B) Radically Polymerizable Compound
B-1: NK Ester M-40G (manufactured by Shin-Nakamura Chemical Co., Ltd.)
B-2: SR-209 (manufactured by Sartomer Co., Ltd.)
B-3: NK Ester A-9300 (manufactured by Shin-Nakamura Chemical Co., Ltd.)
B-4: A-TMMT (Shin-Nakamura Chemical Co., Ltd.)

(C) Photo-Radical Polymerization Initiator
C-1: IRGACURE OXE 01 (manufactured by BASF)
C-2: IRGACURE OXE 02 (manufactured by BASF)
C-3: IRGACURE OXE 04 (manufactured by BASF)
C-4: IRGACURE-784 (manufactured by BASF)
C-5: NCI-831 (manufactured by ADEKA Corporation)

(D) Thermal-Base Generator
D-1: The following compound
D-2: The following compound
D-3: The following compound

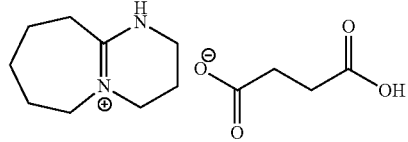

D-1

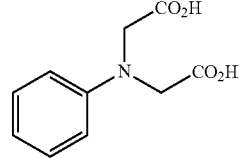

D-2

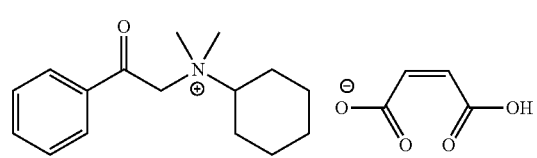

D-3

(E) Polymerization Inhibitor
E-1: 1,4-Benzoquinone
E-2: 1,4-Methoxyphenol (F) Migration Suppressing Agent
F-1: 1,2,4-Triazole
F-2: 1H-Tetrazole (G) Silane Coupling Agent
G-1: The following compound
G-2: The following compound
G-3: The following compound

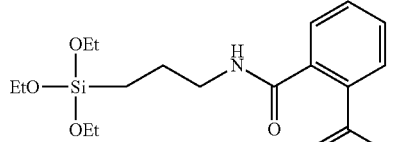

G-1

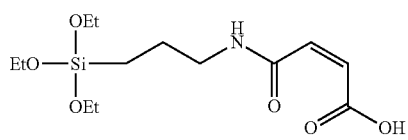

G-2

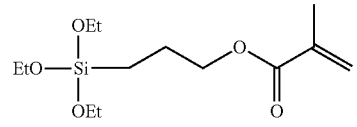

G-3

(H) Solvent
H-1: γ-Butyrolactone
H-2: Dimethyl sulfoxide
H-3: N-methyl-2-pyrrolidone
H-4: Ethyl lactate Additionally, about the solvent in Table 1, in a case where the column of a kind is "H-1/H-2" and the column of parts by mass is "48+12", this means that 48 parts by mass of H-1 and 12 parts by mass of H-2 are included. The same applies to the other components.

(mass ratio of component A-3)]+[16.5 (acid value of A-8)× 16.9/(16.0+16.9) (mass ratio of component A-8)]=10.2 mgKOH/g. The acid value of Example 19, which is calculated in the same manner, is 13.5 mgKOH/g.

As is clear from the above results, the composition according to the embodiment of the present invention was a composition excellent in storage stability and breaking elongation (Examples 1 to 19). In particular, it was found that compositions more excellent in breaking elongation can be obtained (comparison between Examples 1, 2, and 5 to 8, and Examples 3, 4, 9, 10, 13 to 16, and 18) by setting the acid value to 5.5 mgKOH/g or more. In addition, it was

TABLE 1

|  | (A) Polymer precursor | | (B) Radically polymerizable compound | | (C) Photo-radical polymerization initiator | | (D) Thermal-base generator | | (E) Polymerization inhibitor | |
| --- | --- | --- | --- | --- | --- | --- | --- | --- | --- | --- |
|  | Type | Parts by mass | Type | Mass | Type | Mass | Type | Mass | Type | Mass |
| Example 1 | A-1 | 32.9 | B-1 | 5.0 | C-1 | 1.2 |  |  | E-1 | 0.08 |
| Example 2 | A-1 | 33.0 | B-2 | 5.0 | C-1 | 1.2 |  |  | E-1 | 0.08 |
| Example 3 | A-2 | 32.4 | B-4 | 5.0 | C-5 | 1.2 | D-1 | 0.5 | E-1 | 0.08 |
| Example 4 | A-2 | 31.6 | B-1 | 7.0 | C-1 | 1.2 |  |  | E-2 | 0.08 |
| Example 5 | A-3 | 32.5 | B-2 | 5.0 | C-4 | 1.2 | D-3 | 0.5 | E-1 | 0.08 |
| Example 6 | A-3 | 33.0 | B-3 | 5.0 | C-1 | 1.2 |  |  |  |  |
| Example 7 | A-4 | 32.4 | B-1 | 5.0 | C-3 | 1.2 | D-3 | 0.5 | E-1 | 0.08 |
| Example 8 | A-4 | 32.9 | B-2 | 5.0 | C-1 | 1.2 |  |  | E-1 | 0.08 |
| Example 9 | A-5 | 18.2 | B-4 | 20.0 | C-1 | 1.2 | D-1 | 0.5 |  |  |
| Example 10 | A-5 | 17.9 | B-1 | 20.0 | C-2 | 1.2 |  |  | E-1 | 0.08 |
| Example 11 | A-6 | 33.2 | B-2 | 5.0 | C-1 | 1.2 | D-2 | 0.5 | E-2 | 0.08 |
| Example 12 | A-6 | 32.9 | B-3 | 5.0 | C-1 | 1.2 |  |  | E-1 | 0.08 |
| Example 13 | A-7 | 32.9 | B-2 | 5.0 | C-1 | 1.2 |  |  | E-1 | 0.08 |
| Example 14 | A-7 | 32.4 | B-2 | 5.0 | C-1 | 1.2 | D-3 | 0.5 | E-1 | 0.08 |
| Example 15 | A-8 | 33.6 | B-3 | 5.0 | C-1 | 1.2 |  |  | E-1 | 0.08 |
| Example 16 | A-8 | 32.4 | B-2 | 5.0 | C-1 | 1.2 | D-1 | 0.5 | E-1 | 0.08 |
| Example 17 | A-12 | 22.9 | B-3 | 15.0 | C-1 | 1.2 |  |  | E-1 | 0.08 |
| Example 18 | A-3/A-8 | 16.0 + 16.9 | B-2 | 5.0 | C-1 | 1.2 |  |  | E-1 | 0.08 |
| Example 19 | A-10/A-11 | 20.0 + 12.9 | B-2 | 5.0 | C-1 | 1.2 |  |  | E-1 | 0.08 |
| Comparative Example 1 | A-9 | 17.9 | B-1 | 20.0 | C-1 | 1.2 |  |  | E-1 | 0.08 |
| Comparative Example 2 | A-10 | 32.9 | B-1 | 5.0 | C-1 | 1.2 |  |  | E-1 | 0.08 |
| Comparative Example 3 | A-11 | 32.4 | B-2 | 5.0 | C-1 | 1.2 | D-1 | 0.5 | E-1 | 0.08 |

|  | (F) Migration suppressing agent | | (G) Silane coupling agent | | (H) Solvent | | Storage stability | Breaking elongation |
| --- | --- | --- | --- | --- | --- | --- | --- | --- |
|  | Type | Mass | Type | Parts by mass | Type | Mass | | |
| Example 1 | F-1 | 0.12 | G-1 | 0.7 | H-1/H-2 | 48 + 12 | A | D |
| Example 2 | F-2 | 0.12 | G-2 | 0.7 | H-3 | 60 | A | D |
| Example 3 | F-1 | 0.12 | G-1 | 0.7 | H-1/H-2 | 48 + 12 | A | A |
| Example 4 | F-2 | 0.12 |  |  | H-1/H-2 | 42 + 18 | A | B |
| Example 5 |  |  | G-3 | 0.7 | H-1/H-2 | 36 + 24 | A | D |
| Example 6 | F-2 | 0.12 | G-2 | 0.7 | H-1/H-4 | 48 + 12 | A | D |
| Example 7 | F-2 | 0.12 | G-1 | 0.7 | H-1/H-2 | 42 + 18 | A | C |
| Example 8 | F-1 | 0.12 | G-2 | 0.7 | H-1/H-2 | 48 + 12 | A | D |
| Example 9 | F-2 | 0.12 |  |  | H-3/H-4 | 48 + 12 | B | B |
| Example 10 | F-1 | 0.12 | G-1 | 0.7 | H-3 | 60 | B | C |
| Example 11 |  |  |  |  | H-1/H-2 | 42 + 18 | C | A |
| Example 12 | F-2 | 0.12 | G-1 | 0.7 | H-1/H-2 | 48 + 12 | C | B |
| Example 13 | F-2 | 0.12 | G-2 | 0.7 | H-1/H-2 | 48 + 12 | A | B |
| Example 14 | F-2 | 0.12 | G-2 | 0.7 | H-1/H-2 | 48 + 12 | A | A |
| Example 15 | F-1 | 0.12 |  |  | H-3/H-2 | 48 + 12 | A | B |
| Example 16 | F-2 | 0.12 | G-2 | 0.7 | H-1/H-2 | 48 + 12 | A | A |
| Example 17 | F-1 | 0.12 | G-2 | 0.7 | H-1/H-2 | 48 + 12 | B | D |
| Example 18 | F-2 | 0.12 | G-2 | 0.7 | H-1/H-2 | 48 + 12 | A | B |
| Example 19 | F-2 | 0.12 | G-2 | 0.7 | H-1/H-2 | 48 + 12 | C | C |
| Comparative Example 1 | F-2 | 0.12 | G-1 | 0.7 | H-3 | 60 | B | E |
| Comparative Example 2 | F-1 | 0.12 | G-2 | 0.7 | H-1/H-2 | 48 + 12 | B | E |
| Comparative Example 3 | F-1 | 0.12 | G-1 | 0.7 | H-1/H-2 | 48 + 12 | D | C |

In Table 1 above, the acid value of a polymer precursor in Example 18 is [3.6 (acid value of A-3)×16.0/(16.0+16.9)

found that compositions more excellent in storage stability can be obtained (comparison between Examples 11 and 12, and Examples 3, 4, 9, 10, 13 to 16, and 18) by setting the acid value to 17.0 mgKOH/g or less.

In addition, compositions excellent in breaking elongation were obtained (comparison between Example 17 and Examples 3, 4, 9, 10, 13 to 16, and 18) by a heterocyclic ring-containing polymer's having a polymerizable group.

In contrast, in a case where the acid value was out of the range of the present invention (Comparative Examples 1 to 3), the storage stability or breaking elongation was inferior.

Example 100

The photosensitive resin composition was coated onto a silicon wafer by a spin coating method using the photosensitive resin composition of Example 1. The silicon wafer coated with the photosensitive resin composition layer was dried at 100° C. for 5 minutes on a hot plate to form a uniform photosensitive resin composition layer with a thickness of 15 m on the silicon wafer. The photosensitive resin composition layer on the silicon wafer was exposed with an exposure energy of 500 mJ/cm² using a stepper (NSR2005i9C, manufactured by Nikon Corporation), and the exposed photosensitive resin composition layer (resin layer) was developed with cyclopentanone (Clog P is 0.31) for 60 seconds to form a hole having a diameter of 10 m. The temperature was then raised at a temperature elevation rate of 10° C./min under a nitrogen atmosphere, and after reaching 250° C., heating was performed for 3 hours. After cooling to room temperature, a copper thin layer (metal layer) having a thickness of 2 m was formed on the surface of the photosensitive resin composition layer by a vapor deposition method so as to cover the above-mentioned hole portion. Furthermore, the procedure from filtering the photosensitive resin composition to heating of the patterned film for 3 hours was performed again, in the same manner as described above, on the surface of the metal layer and the photosensitive resin composition layer, to produce a laminate having a resin layer/a metal layer/a resin layer using the same type of photosensitive resin composition.

This interlayer insulating film for a re-distribution layer was excellent in insulating properties.

In addition, this interlayer insulating film for a re-distribution layer was used to produce a semiconductor device. As a result, it was confirmed that the semiconductor device operates without problems.

EXPLANATION OF REFERENCES

100: Semiconductor device
101a to 101d: Semiconductor elements
101: Laminate
102b to 102d: Through-electrode
103a to 103e: Metal bump
105: Re-distribution layer
110, 110a, 110b: Underfill layer
115: Insulating film
120: Wiring board
120a: Surface electrode

What is claimed is:
1. A photosensitive resin composition comprising:
   a polymer precursor selected from a polyimide precursor and a polybenzoxazole precursor;
   a photo-radical polymerization initiator; and
   a solvent,
   wherein an acid value of an acid group contained in the polymer precursor and having a neutralization point in a pH range of 7.0 to 12.0 is in a range of 2.5 to 34.0 mgKOH/g, and
   either the polymer precursor contains a radically polymerizable group or the photosensitive resin composition includes a radically polymerizable compound other than the polymer precursor.

2. The photosensitive resin composition according to claim 1,
   wherein the acid value of the acid group contained in the polymer precursor and having a neutralization point in a pH range of 7.0 to 12.0 is in a range of 5.5 to 17.0 mgKOH/g.

3. The photosensitive resin composition according to claim 1,
   wherein the polymer precursor contains a repeating unit represented by Formula (1) or a repeating unit represented by Formula (2), Formula (1)

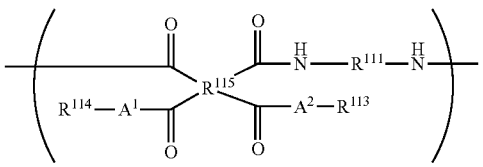

in Formula (1), $A^1$ and $A^2$ each independently represent an oxygen atom or NH, $R^{111}$ represents a divalent organic group, $R^{115}$ represents a tetravalent organic group, and $R^{113}$ and $R^{114}$ each independently represent a hydrogen atom or a monovalent organic group;

Formula (2)

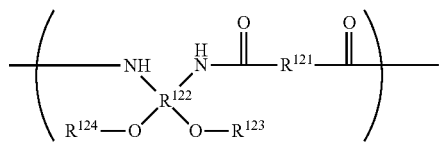

in Formula (2), $R^{121}$ represents a divalent organic group, $R^{122}$ represents a tetravalent organic group, and $R^{123}$ and $R^{124}$ each independently represent a hydrogen atom or a monovalent organic group;
at least one of the repeating units represented by Formula (1) is a repeating unit in which at least one of —C(=O)A²-$R^{113}$ or —C(=O)A¹-$R^{114}$ contains the acid group having a neutralization point in a pH range of 7.0 to 12.0, and
at least one of the repeating units represented by Formula (2) is a repeating unit in which —$R^{122}$—O—$R^{123}$ or —$R^{122}$—O—$R^{124}$ at least one of contains the acid group having a neutralization point in a pH range of 7.0 to 12.0.

4. The photosensitive resin composition according to claim 3,
   wherein at least one of the repeating units represented by Formula (1) is a repeating unit in which at least one of $R^{113}$ or $R^{114}$ contains a radically polymerizable group, or at least one of the repeating units represented by Formula (2) is a repeating unit in which at least one of $R^{123}$ or $R^{124}$ contains a radically polymerizable group.

5. The photosensitive resin composition according to claim 3, wherein the polymer precursor contains the repeating unit represented by Formula (1).

6. The photosensitive resin composition according to claim 1, further comprising the radically polymerizable compound other than the polymer precursor.

7. The photosensitive resin composition according to claim 1, further comprising a thermal-base generator.

8. The photosensitive resin composition according to claim 1, further comprising a photo-base generator.

9. The photosensitive resin composition according to claim 1, further comprising a polymerization inhibitor.

10. The photosensitive resin composition according to claim 1, which is used for development using a developer which includes an organic solvent.

11. The photosensitive resin composition according to claim 10, wherein 50% by mass or more of the developer is an organic solvent.

12. The photosensitive resin composition according to claim 10, wherein the developer includes an organic solvent having a Clog P of −1 to 5.

13. The photosensitive resin composition according to claim 1, which is used for forming an interlayer insulating film for a re-distribution layer.

14. The photosensitive resin composition according to claim 1, wherein the polymer precursor is a polyimide precursor, and the acid value of the acid group contained in the polymer precursor and having a neutralization point in a pH range of 7.0 to 12.0 is in a range of 3.6 to 22.2 mgKOH/g.

15. A photosensitive resin composition comprising:
a polymer precursor selected from a polyimide precursor and a polybenzoxazole precursor;
a photo-radical polymerization initiator; and
a solvent,
wherein an acid value of an acid group contained in the polymer precursor and having a neutralization point in a pH range of 7.0 to 12.0 is in a range of 2.5 to 34.0 MgKOH/g,
the polymer precursor contains a carboxyl group, and
either the polymer precursor contains a radically polymerizable group or the photosensitive resin composition includes a radically polymerizable compound other than the polymer precursor.

16. A polymer precursor comprising a repeating unit represented by Formula (1) or a repeating unit represented by Formula (2), Formula (1)

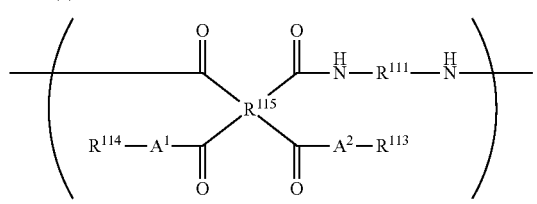

in Formula (1), $A^1$ and $A^2$ each independently represent an oxygen atom or NH, $R^{111}$ represents a divalent organic group, $R^{115}$ represents a tetravalent organic group, and $R^{113}$ and $R^{114}$ each independently represent a hydrogen atom or a monovalent organic group;

Formula (2)

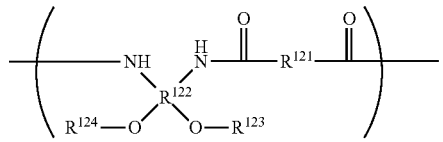

in Formula (2), $R^{121}$ represents a divalent organic group, $R^{122}$ represents a tetravalent organic group, and $R^{123}$ and $R^{124}$ each independently represent a hydrogen atom or a monovalent organic group; and at least one of the repeating units represented by Formula (1) is a repeating unit in which at least one of —C(=O)$A^2$-$R^{113}$ or —C(=O)$A^1$-$R^{114}$ contains an acid group having a neutralization point in a pH range of 7.0 to 12.0, and at least one of the repeating units represented by Formula (2) is a repeating unit in which —$R^{122}$—O—$R^{123}$ or —$R^{122}$—O—$R^{124}$ at least one of contains the acid group having a neutralization point in a pH range of 7.0 to 12.0.

17. The polymer precursor according to claim 16, wherein an acid value of the acid group having a neutralization point in a pH range of 7.0 to 12.0 is in a range of 5.5 to 17.0 mgKOH/g.

18. The polymer precursor according to claim 16, wherein at least one of the repeating units represented by Formula (1) is a repeating unit in which at least one of $R^{113}$ or $R^{114}$ contains a radically polymerizable group, or at least one of the repeating units represented by Formula (2) is a repeating unit in which at least one of $R^{123}$ or $R^{124}$ contains a radically polymerizable group.

19. The polymer precursor according to claim 16, wherein the polymer precursor is a polyimide precursor, and the acid value of the acid group contained in the polymer precursor and having a neutralization point in a pH range of 7.0 to 12.0 is in a range of 3.6 to 22.2 mgKOH/g.

20. A cured film formed from the photosensitive resin composition according to claim 1.

21. A laminate comprising two or more cured films according to claim 20.

22. The laminate according to claim 21, further comprising a metal layer between the cured films.

23. A method for producing a cured film, comprising using the photosensitive resin composition according to claim 1.

24. The method for producing a cured film according to claim 23, comprising:
applying the photosensitive resin composition to a substrate to form a layer;
exposing the photosensitive resin composition layer; and
performing a development treatment for the exposed photosensitive resin composition layer.

25. The method for producing a cured film according to claim 24,
  wherein heating at 40° C. or more is not included between the exposing and the performing the development treatment.

26. The method for producing a cured film according to claim 24, wherein the development treatment is performed using a developer which includes 50% by mass or more of an organic solvent.

27. The method for producing a cured film according to claim 23,
  wherein the development treatment is performed using a developer which includes an organic solvent having a Clog P of −1 to 5.

28. A semiconductor device comprising the cured film according to claim 20.

* * * * *